(12) United States Patent
Bell

(10) Patent No.: US 7,178,344 B2
(45) Date of Patent: Feb. 20, 2007

(54) THERMOELECTRIC HEAT EXCHANGER

(75) Inventor: Lon E. Bell, Altadena, CA (US)

(73) Assignee: Amerigon, Inc., Irwindale, CA (US)

( * ) Notice: Subject to any disclaimer, the term of this patent is extended or adjusted under 35 U.S.C. 154(b) by 0 days.

(21) Appl. No.: 11/158,908

(22) Filed: Jun. 21, 2005

(65) Prior Publication Data
US 2006/0048518 A1    Mar. 9, 2006

Related U.S. Application Data

(63) Continuation of application No. 10/608,807, filed on Jun. 27, 2003, now Pat. No. 6,907,739, which is a continuation-in-part of application No. 09/847,856, filed on May 1, 2001, now abandoned, which is a continuation of application No. 09/428,018, filed on Oct. 27, 1999, now Pat. No. 6,223,539, which is a continuation of application No. 09/076,518, filed on May 12, 1998, now Pat. No. 6,119,463.

(51) Int. Cl.
F25B 21/02    (2006.01)
F25D 23/12    (2006.01)
F28D 11/00    (2006.01)
F28F 5/00    (2006.01)

(52) U.S. Cl. .............. 62/3.7; 62/259.3; 165/86
(58) Field of Classification Search .............. 62/3.7, 62/3.61, 259.3; 165/86
See application file for complete search history.

(56) References Cited

U.S. PATENT DOCUMENTS

| | | | |
|---|---|---|---|
| 2,362,259 A | 11/1944 | Findley | |
| 2,363,168 A | 11/1944 | Findley | |
| 2,519,241 A | 8/1950 | Findley | |
| 2,984,077 A | 5/1961 | Gaskill | |
| 3,019,609 A | * 2/1962 | Pietsch | 62/3.3 |
| 3,085,405 A | 4/1963 | Franti | |
| 3,137,142 A | 6/1964 | Venema | |
| 3,197,342 A | 7/1965 | Neild | |
| 3,212,275 A | 10/1965 | Tillman | |
| 3,599,437 A | * 8/1971 | Panas | 62/3.3 |

(Continued)

FOREIGN PATENT DOCUMENTS

EP    0 834 421 A1    4/1998

(Continued)

OTHER PUBLICATIONS

Search Report for PCT/US 99/10333, mailed Aug. 27, 1999.

(Continued)

*Primary Examiner*—William C. Doerrler
(74) *Attorney, Agent, or Firm*—Knobbe Martens Olson & Bear LLP

(57) ABSTRACT

Disclosed is a system for thermally conditioning and pumping a fluid. The system includes a thermoelectric heat exchanger having a thermoelectric device configured to pump heat. Heat exchangers are provided for transferring heat to and from the thermoelectric device and for generating a fluid flow across the thermoelectric device. The conditioned fluid may be placed in thermal communication with a variety of objects, such as a vehicle seat, or anywhere localized heating and cooling are desired. Thermal isolation may also be provided in the direction of flow to enhance efficiency.

14 Claims, 19 Drawing Sheets

U.S. PATENT DOCUMENTS

| | | | |
|---|---|---|---|
| 4,665,707 A | 5/1987 | Hamilton | |
| 4,823,554 A | 4/1989 | Trachtenberg | |
| 4,988,847 A | 1/1991 | Argos et al. | |
| 5,111,664 A | 5/1992 | Yang | |
| 5,419,780 A | 5/1995 | Suski | |
| 5,448,891 A | 9/1995 | Nakagiri et al. | |
| 5,524,439 A * | 6/1996 | Gallup et al. | 62/3.5 |
| 5,544,487 A | 8/1996 | Attey et al. | |
| 5,561,981 A | 10/1996 | Quisenberry et al. | |
| 5,822,993 A | 10/1998 | Attey | |
| 6,119,463 A * | 9/2000 | Bell | 62/3.7 |
| 6,213,198 B1 | 4/2001 | Shikata et al. | |
| 6,223,539 B1 * | 5/2001 | Bell | 62/3.7 |
| 6,606,866 B2 | 8/2003 | Bell | |

FOREIGN PATENT DOCUMENTS

| | | |
|---|---|---|
| JP | 60-80044 | 5/1985 |
| JP | 60-80044 | 11/1989 |
| JP | 01 281344 A | 1/1990 |
| JP | 04-165234 | 6/1992 |
| LU | 66619 A | 2/1973 |
| WO | WO 94/20801 A | 9/1994 |
| WO | WO 95/14899 A | 6/1995 |
| WO | WO 95/31688 A | 11/1995 |

OTHER PUBLICATIONS

Search Report for EP 04 00 6634, mailed May 13, 2005.

Office Action in corresponding Japanese Patent Application JP 2000-548669, mailed Aug. 2, 2005.

* cited by examiner

THERMOELECTRIC HEAT EXCHANGER

PRIOR APPLICATION DATA

This application is a continuation of U.S. patent application Ser. No. 10/608,807 filed Jun. 27, 2003, now U.S. Pat. No 6,907,739, which is a continuation of U.S. patent application Ser. No. 09/971,539, filed Oct. 2, 2001, now U.S. Pat. No. 6,606,866, which is a continuation-in-part of U.S. patent application Ser. No. 09/847,856 filed May 1, 2001, abandoned, which is a continuation of U.S. application Ser. No. 09/428,018, filed Oct. 27, 1999, now U.S. Pat. No. 6,223,539, which is a continuation of U.S. application Ser. No. 09/076,518, filed May 12, 1998, now U.S. Pat. No. 6,119,463.

BACKGROUND OF THE INVENTION

The present invention relates to temperature control devices. More particularly, the present invention relates to a thermoelectric heat exchanger that is particularly useful for converting electricity to a flow of conditioned air. The air may be heated or cooled.

Modern automobile seats may be equipped with temperature control systems that allow the occupant to vary the temperature of the seat by flowing temperature-controlled air through the seat covering. One type of system comprises a seat having a heat transfer system mounted therein, such as a thermoelectric element configured to heat or cool air that is moved over the element using a separate fan unit that is also mounted within the seat. The conditioned air is distributed to the occupant by passing the air through the seat surface via a series of air ducts within the seat.

The amount of space available within, below and around the seat for such temperature control systems is severely limited. In some cars, to save weight or increase passenger room, the seats are a few inches thick and abut the adjacent structure of the car, such as the floorboard or the back of the car. Further, automobile manufacturers are increasingly mounting various devices, such as electronic components or variable lumbar supports, within, below and around the seat. Additionally, the size of the seat, particularly the seat back, needs to be as small as possible to reduce the amount of cabin space consumed by the seat.

Present temperature control systems are often too large to be mounted within, below or around vehicle seats. Conventional systems may have a squirrel cage fan five or six inches in diameter generating an air flow that passes through a duct to reach a heat exchanger that adjusts the temperature of the air. The heat exchanger is several inches wide and long, and at least an inch or so thick. From the heat exchanger the air is transported through ducts to the bottom of the seat cushion and to the back of the seat cushion. Such systems are bulky and difficult to fit underneath or inside car seats. Using thermoelectric devices to heat and cool the heat exchanger helps reduce the size of unit, but still requires a large volume for the combined heating and cooling system.

The ducting used with these systems is also bulky and difficult to use if the duct must go from a seat bottom to a seat back that is allowed to pivot or rotate. These ducts not only use additional space within the seat, but also resist air flow and thus require a larger fan to provide the air flow, and the larger fan requires additional space or else runs at greater speeds and generates more noise. Noise is undesirable inside motor vehicles. Further, the ducting affects the temperature of the passing air and either heats cool air, or cools heated air, with the result of often requiring larger fans or heat exchangers. In light of these drawbacks, there is a need for a more compact and energy efficient heating and cooling system for automobile seats, and preferably a quieter system. In addition, a more compact and energy-efficient heating and cooling system useful in seats also has uses in other localized conditioned air settings.

SUMMARY OF THE INVENTION

The present devices use air flow generators, such as fan blades, that act as both a heat exchanger to transfer a thermal differential from a thermoelectric device and thereby condition air passing over the heat exchanger, and that act as an air pump. The heat exchanger rotates and provides aerodynamic and centrifugal force to the air passing through the heat exchanger to generate pressurized air for distribution, such as to the seat of a motor vehicle.

An improved thermoelectric heat exchanger system is disclosed. The heat exchanger system has a first heat exchanger formed about an axis and configured such that fluid flows along the first heat exchanger at least partially in a first direction, and a second heat exchanger formed about the axis and configured such that fluid flows along the second heat exchanger at least partially in a direction other than the first direction. A thermoelectric device having opposing surfaces exhibits a temperature gradient between one surface and an opposing surface in response to electrical current flowing through the thermoelectric device. The one surface is in thermal communication with the first heat exchanger and the opposing surface is in thermal communication with the second heat exchanger.

Several different combinations of fluid flow directions are disclosed. For example: the first direction is at least partially outward from the axis; the first direction is at least partially perpendicular to the axis; the second direction is at least partially along the axis, while the first direction is generally outward or away from the axis; the first direction is at least partially at an angle from the axis, and the second direction is at least partially at an angle from the axis; the first direction is at least partially along the axis, and the second direction is at least partially at an angle from the axis.

In one embodiment, a heat transfer member is in thermal communication with the one or the opposing surface of the thermoelectric device and in thermal communication with the first or second heat exchanger. Another heat transfer member may also be provided in thermal communication with the other surface and with the other heat exchanger.

At least one of the first and second heat exchangers may be formed in segments to provide thermal isolation in the direction of flow. The heat transfer members may also be formed in segments to provide thermal isolation in the direction of flow, where one or more heat transfer members are used. Where the heat exchanger is made from a plurality of blades, thermal isolation may be provided by spaces in the blades in the direction of flow.

A housing containing at least one of the first and the second heat exchangers may be use to form an outlet through which air exits after passing through the at least one of the first or second heat exchangers. An auxiliary fan may also be used in conjunction with the heat exchangers. In certain configurations, the heat exchangers themselves generate fluid flow. These configurations may also use the auxiliary fan to augment the flow. The auxiliary fan may also be used as the primary or only fluid flow generator.

A thermoelectric heat exchanger system is also disclosed that has a thermoelectric device configured to generate a thermal gradient between a first temperature side and a second temperature side in response to an electrical current with at least one first heat exchanger in thermal communication with the first or the second temperature side of the thermoelectric device, wherein the heat exchanger is rotatable about a rotational axis. In this embodiment, an auxiliary fan is configured to rotate about the rotational axis and to generate fluid flow along the heat exchanger. In one embodiment, the first heat exchanger may be oriented such that fluid flow from the auxiliary fan flows through the heat exchanger along the rotational axis.

A second heat exchanger may also be provided configured to generate a fluid flow in a first direction away from the rotational axis with rotation about the rotational axis. In such case, the first heat exchanger is preferably oriented such that fluid flow generated by the auxiliary fan flows through the first heat exchanger in a second direction other than the first direction. Advantageously, the heat exchanger is constructed to provide thermal isolation in the direction of flow, such as with segments in blades or the like.

Another heat exchanger system is disclosed wherein a thermoelectric device formed about an axis and has opposing surfaces that generate a temperature gradient between one surface and an opposing surface in response to electrical current flowing through the thermoelectric device. In this heat exchanger system, first and second heat exchangers are formed about the axis and configured such that fluid flows along the first heat exchanger and along the second heat exchanger generally away from the axis. The first heat exchanger is in thermal communication with the one surface, and the second heat exchanger is in thermal communication with the opposing surface. At least one of the first and second heat exchangers is formed to provide thermal isolation in the direction of fluid flow between a plurality of portions of the at least one heat exchanger.

This configuration can be constructed such that the heat exchangers and thermoelectric device rotate about the axis during operation, at least one of the heat exchangers operating to induce fluid flow through the heat exchangers. Alternatively, the heat exchangers and thermoelectric device are stationary, but an auxiliary fan rotates about the axis and causes fluid to flow along at least one of the first and second heat exchangers. In one preferred embodiment of this system, at least one of the first and second heat exchangers is formed in segments to provide the thermal isolation.

Yet another thermoelectric heat exchanger system is disclosed with a thermoelectric device formed about an axis and having opposing surfaces that generate a temperature gradient between one surface and an opposing surface in response to electrical current flowing through the thermoelectric device. First and second heat exchangers are about the axis and configured such that fluid flows along the first heat exchanger and along the second heat exchanger generally away from the axis. The first heat exchanger is in thermal communication with the one surface, and the second heat exchanger is in thermal communication with the opposing surface. An auxiliary fan rotates about the axis and generates fluid flow along at least one of the first and second heat exchangers. Preferably, at least one of the first and second heat exchangers is formed to provide the thermal isolation in the direction of flow, such as through construction in a plurality of substantially thermally isolated segments.

A method of conditioning a fluid flow is also contemplated which involves the steps of flowing current through a thermoelectric device having opposing surfaces to generate a temperature gradient between a first surface and a second surface of the thermoelectric device, flowing a fluid along a first heat exchanger formed about an axis at least partially in a first direction, the first heat exchanger in thermal communication with the first surface, and flowing a fluid along a second heat exchanger formed about the axis at least partially in a direction other than the first direction, the second heat exchanger in thermal communication with the second surface.

The direction may be in any reasonable configuration, such as, but not limited to: the first direction is at least partially outward from the axis; the first direction is at least partially perpendicular to the axis; the second direction is at least partially along the axis; the first direction is at least partially at an angle from the axis, and the second direction is at least partially at an angle from the axis and; the first direction is at least partially along the axis, and the second direction is at least partially at an angle from the axis.

Advantageously, the method further involves forming at least one of the first and second heat exchangers to provide thermal isolation in the direction of flow, such as forming the heat exchangers in segments. The flowing of fluid may be provided by an auxiliary fan that rotates about the axis. In addition, or alternatively, the flowing of fluid may be provided by the first or second heat exchanger rotating about the axis.

Yet another method is disclosed, involving the steps of flowing current through a thermoelectric device having opposing surfaces to generate a temperature gradient between a first surface and a second surface of the thermoelectric device, flowing a fluid along a first heat exchanger formed and rotational about an axis, the first heat exchanger in thermal communication with the first surface. The flowing is at least partially provided via an auxiliary fan configured to rotate about the axis and to generate fluid flow along the first heat exchanger.

In one embodiment, the first heat exchanger is oriented such that fluid from the auxiliary fan flows through the heat exchanger along the rotational axis. Generating fluid flow along a second heat exchanger in a direction away from the rotational axis with rotation about the rotational axis may also be provided. The second heat exchanger may at least partially generate the fluid flow along the second heat exchanger. The method may also involve thermally isolating portions or segments of the heat exchanger in the direction of fluid flow.

Another method of conditioning flowing fluid involves the steps of generating a temperature gradient in a thermoelectric device between one surface and an opposing surface and flowing fluid along first and second heat exchangers formed about an axis and configured such that the fluid flows along the first heat exchanger and along the second heat exchanger generally away from the axis, the first heat exchanger in thermal communication with the one surface, and the second heat exchanger in thermal communication with the opposing surface. At least one of the first and second heat exchangers is formed to provide thermal isolation in the direction of fluid flow, such as by using a plurality of segments to form the at least one heat exchanger.

The method may further involve rotating the heat exchangers and thermoelectric device about the axis during operation, the heat exchangers operating to induce fluid flow through the heat exchangers. The heat exchangers and thermoelectric device may also be stationary, wherein fluid flow is generated along at least one of the first and second heat exchangers by rotating an auxiliary fan about the axis.

These and other features are disclosed in further detail below.

BRIEF DESCRIPTION OF THE DRAWINGS

These and other features of the inventions will now be described with reference to the drawings of an embodiment in which like number indicate like parts throughout, and which are intended to illustrate and not to limit the inventions, and in which.

DETAILED DESCRIPTION

A variety of examples described below illustrate various configurations that may be employed to achieve desired improvements. The particular embodiments and examples are only illustrative and not intended in any way to restrict the general inventions presented and the various aspects and features of these inventions. In addition, it should be understood that the terms cooling side, heating side, cold side, hot side, cooler side and hotter side and the like do not indicate any particular temperature, but are relative terms. For examples, the "hot," "heating" or "hotter" side of a thermoelectric element or array may be at ambient temperature, with the "cold," "cooling" or "cooler" side at a cooler temperature than ambient. Conversely, the "cold," "cooling" or "cooler" side may be at ambient with the "hot," "heating" or "hotter" side at a higher temperature than ambient. Thus, the terms are relative to each other to indicate that one side of the thermoelectric is at a higher or lower temperature than the counter-designed side. In addition, fluid flow is referenced in the discussion below as having directions. When such references are made, they generally refer to the direction as depicted in the two dimensional figures. For example, fluid flow for the heat exchanger depicted in FIG. 13 may be described as away from or along an axis about which these heat exchangers are formed. However, it will be understood from the discussion that the flow when the device is rotating is not just away from the axis or along the axis but may actually take the form of a spiral or have a circular motion or other turbulent flow patterns. The terminology indicating "away" from the axis or "along" the axis or any other fluid flow direction described in the application is meant to be an illustrative generalization of the direction of flow as considered from the perspective of two dimensional figures.

Figure 1:
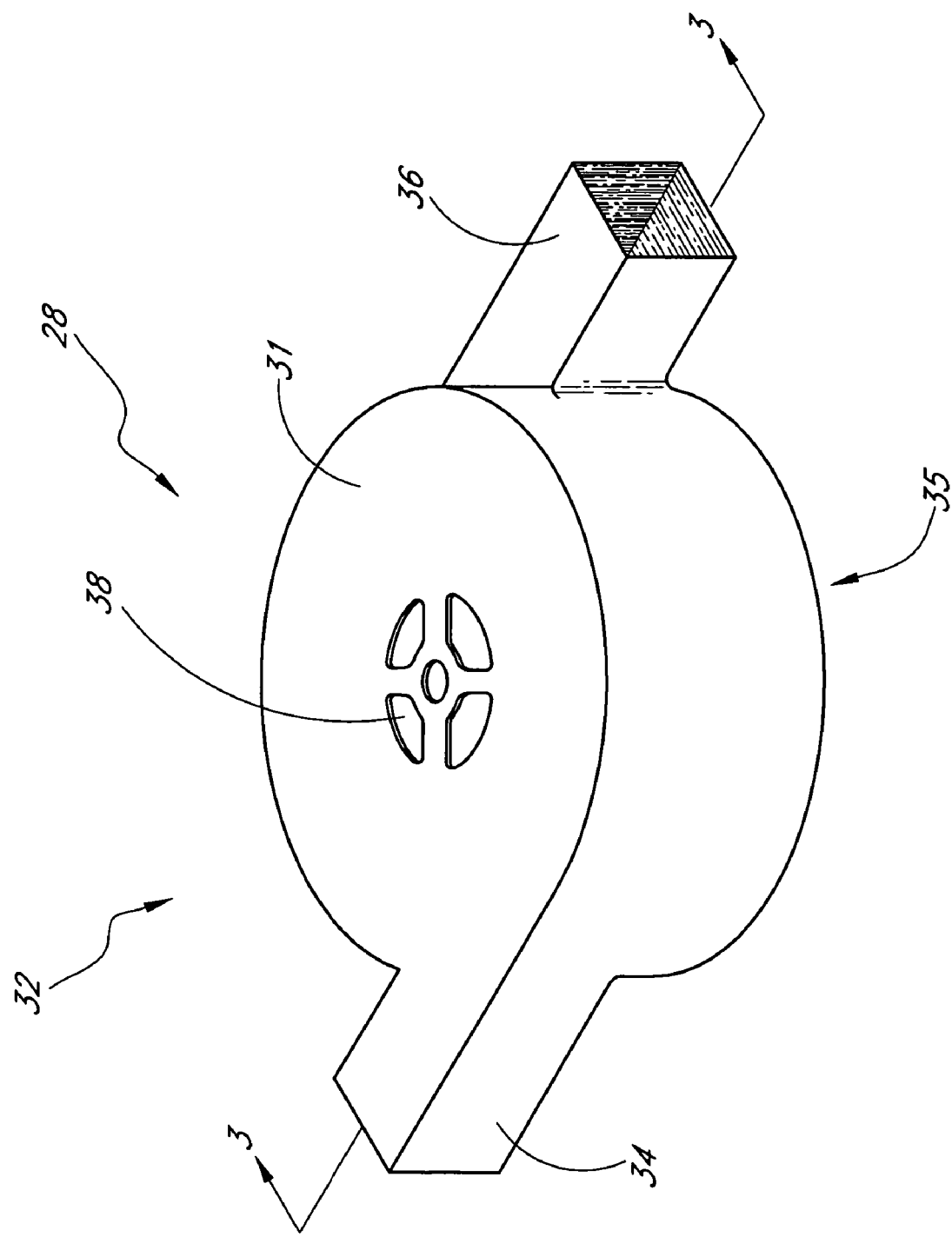
FIG. 1 is a perspective view of the heat exchanger of the present invention.

As shown in FIG. 1, a heat exchanger unit 28 includes an outer housing 32 that defines an interior cavity 29 (FIG. 3) in which a rotor assembly 30 (FIGS. 2 and 3) is rotatably mounted for producing a conditioned airflow into and out of the outer housing 32. While other shapes are suitable, the outer housing 32 is shown as resembling a generally flat disc with a first surface or first wall 31 that corresponds to an upper or top surface if the housing 32 is placed in a seat bottom generally parallel to the ground. As used herein, up or upper will refer to a direction away from the ground. Down, lower or bottom will refer to a direction toward the ground. The relative direction of parts would alter if the entire orientation of housing 32 were changed, as may occur in actual use. A second wall 33, corresponding to a bottom surface, is opposite the first wall 31. The generally circular peripheries of walls 31, 33 are joined by side wall 35 to form an enclosure.

A first outlet 34 extends outwardly from the side wall 35 adjacent the first or upper wall 31 of the outer housing 32. A second outlet 36 extends outwardly from the side wall 35 adjacent the second, or lower wall 33. Advantageously the outlets 34, 36 extend generally tangential from the periphery of the housing 32. The outlets 34, 36 are shown extending in generally opposite directions, about 180° relative to each other. But depending on the particular direction the air needs to flow, the outlets 34, 36 could be located at other angles relative to each other, with 60°, 90° on either side of the housing 32, being the most likely relative positions. The outlets 34, 36 could exit in the same direction if desired, but then it would be advantageous to have insulation between the outlets to help maintain the temperature differential between the outlets.

A set of apertures 38 are centrally formed in the first or top wall 31 of the outer housing 32 to form a first inlet 38 that communicates with the interior cavity 29 formed and enclosed by the outer housing 32. Although not necessary, a second inlet 40 (FIG. 3) may also be located on the second or bottom wall 33 of the outer housing 32 opposite the first inlet 38.

Figure 2:
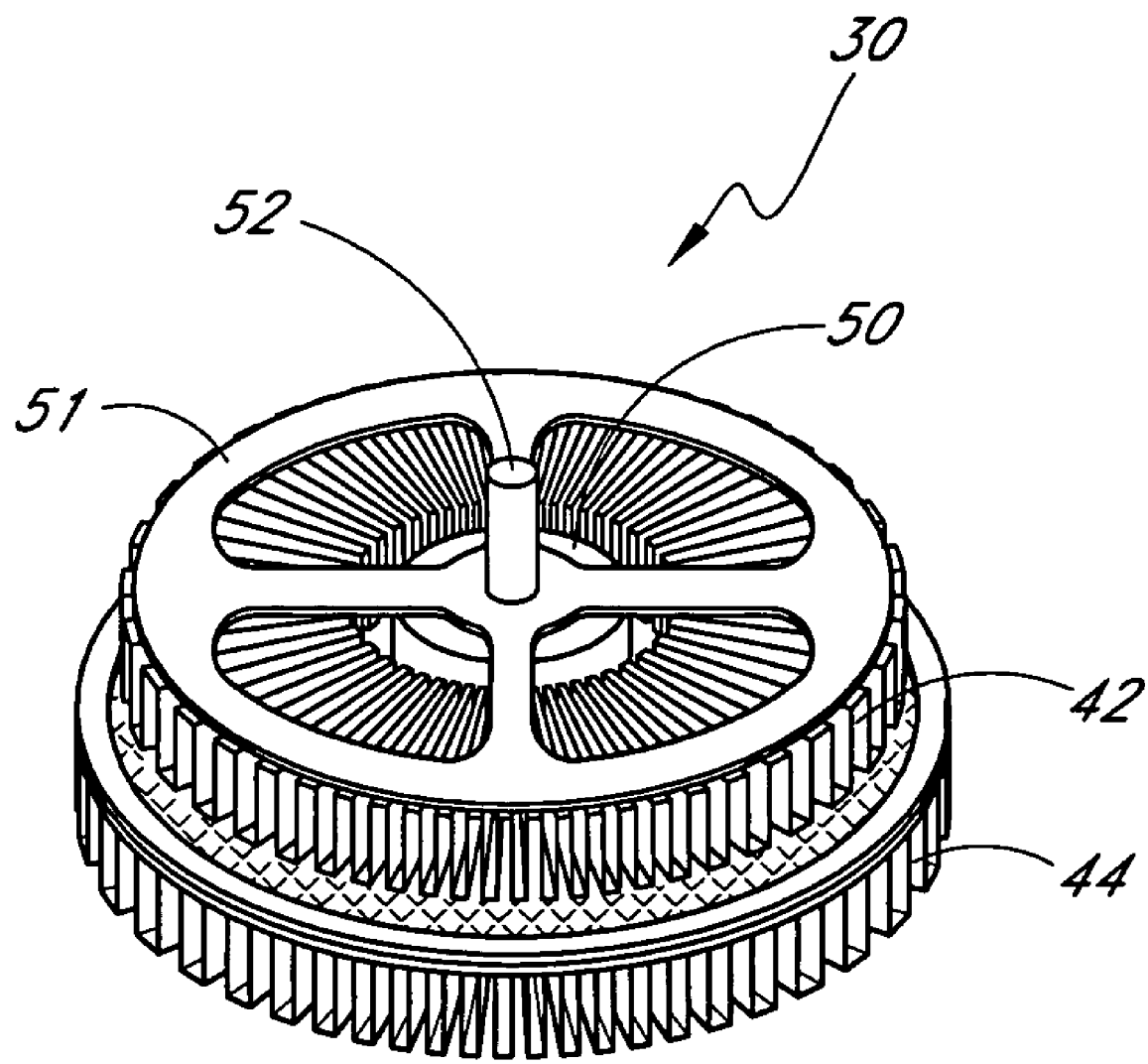
FIG. 2 is a perspective view of a rotary assembly of the heat exchanger of FIG. 1.
Figure 3:
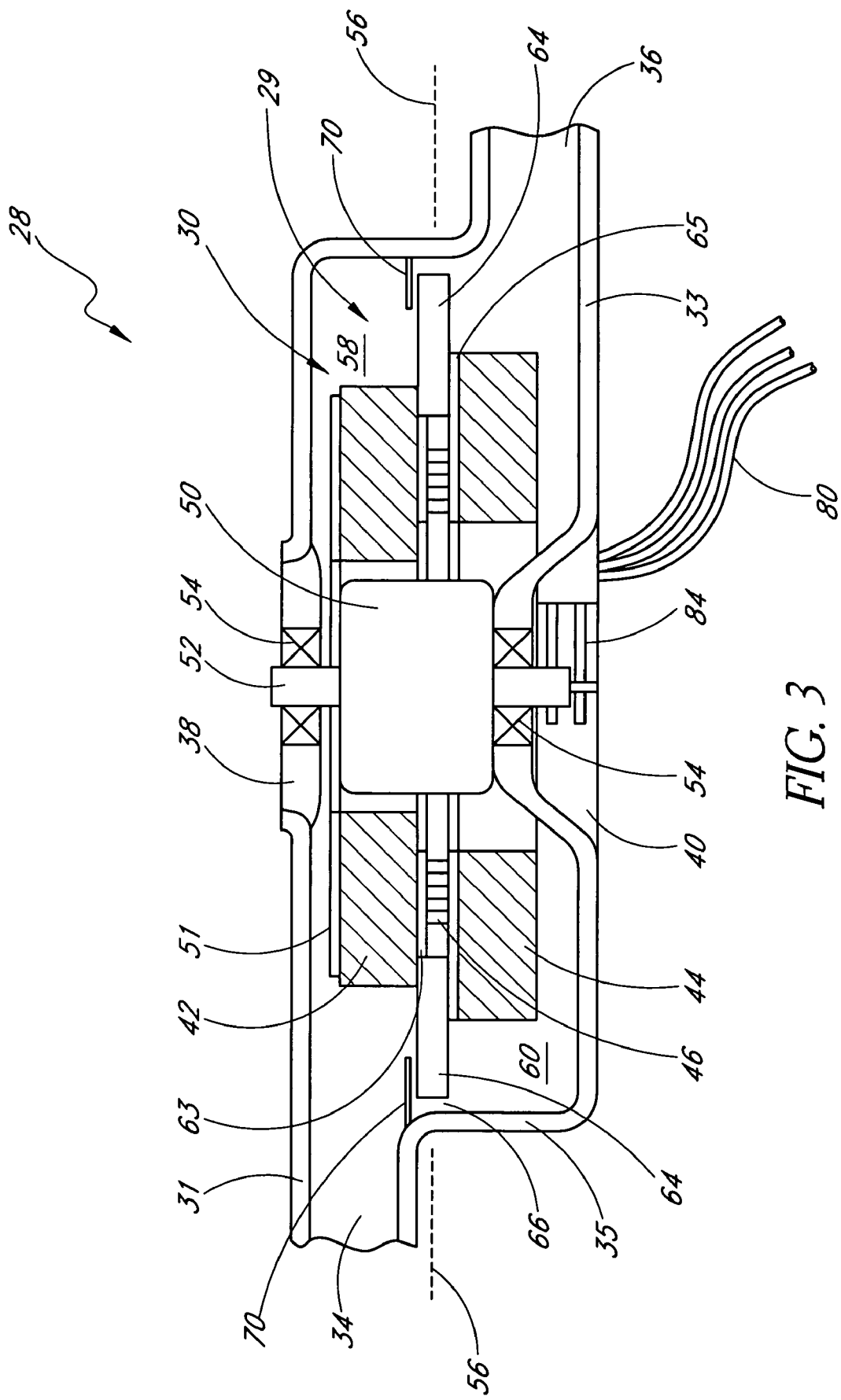
FIG. 3 is a cross-sectional view of the heat exchanger along line 3—3 of FIG. 1.

As illustrated in FIGS. 2 and 3, the rotor assembly 30 generally comprises a plurality of components including an annular first rotor 42, an annular second rotor 44 disposed below the first rotor 42, and at least one annular thermoelectric device 46 interposed between, and in thermal communication with, the first rotor 42 and the second rotor 44. The thermoelectric device depicted is preferably a Peltier device which comprises at least one pair of dissimilar materials connected electrically in series and thermally in parallel, and typically comprises a series of n-type and p-type semiconductor elements connected electrically in series and thermally in parallel. Depending on the direction of current passing through the thermoelectric device 46, one surface will be heated and the opposing surface will be cooled. The thermoelectric device 46 generates a temperature differential that causes heat to transfer by conduction through the rotors 42, 44. The greater the temperature differential, the greater the rate of heat transfer. The temperature differentials and efficiencies are expected to increase as the technology improves.

The rotors 42, 44 comprise annular heat exchangers in direct thermal communication with the thermoelectric device 46 to conduct heat throughout the rotors 42, 44, primarily by thermal conduction to thereby form a short thermal path length between the rotors 42, 44 and the thermoelectric device 46. Depending on the material and construction of the rotors 42, 44, the rate of thermal conduction will vary. The rotors 42, 44 also allow air to pass outward, such as in a radial direction, through the heat exchanger, and further comprise blades of fans that cause the air to pass outward through the rotors 42, 44. The heat exchanger thus forms the fan that causes the air to flow through the heat exchanger. Alternatively phrased, the fan that generates the air flow also forms the heat exchanger. In one embodiment, the fins of the heat exchanger comprise the blades or airfoils of the fan generating the air flow. Alternately, the heat exchanger could comprise a series of heat exchange surfaces that are configured to generate an airflow when the surfaces are rotated.

The rotors 42, 44 are advantageously formed by taking a length of heat exchanger of aluminum or copper that is formed from a flat strip of metal having corrugated or accordion-like pleats folded so heat sinks and sources can be connected at the ends of the pleats where the metal folds to change direction. The pleats are orientated so air can flow along the corrugations of the heat exchanger. The opposing ends of that length of heat exchanger are curved toward each other, and then overlapped and fastened together either mechanically or by thermal or adhesive bonding. This bending forms the previously straight length into a circle so the air flows radially through what is now a circular heat exchanger. In this annular configuration the heat exchanger can effectively act as the blades of a squirrel cage fan or a circular fan. This method is advantageously, but not necessarily, used to form both the first rotor 42 and the second rotor 44.

In the illustrated embodiment, the first rotor 42 is located on the supply side of the heat exchanger that supplies conditioned air to a user, and has an outer diameter that is smaller than the diameter of the second rotor 44. The second rotor 44 is located on the waste side of the system and exhausts conditioned air, advantageously to a location that does not direct air to the supply side or that otherwise directs air to a location that could affect the user. Each of the components are axially aligned to rotate about a central axis aligned with a drive shaft or axle 52 of motor 50. A disc-shaped connector 51 having a central aperture is disposed on top of the first rotor 42 and the motor 50. The motor 50 may be directly coupled to the axle 52 or could be indirectly coupled, such as via a gear assembly.

The connector 51 mechanically couples at least one of the shaft 52 or motor 50 to the first rotor 42 so that the motor 50 is configured to rotatably drive the first rotor 42, the thermoelectric device 46, and the second rotor 44 about a common axis, as described in more detail below. The interior diameter of rotors 42, 44 is advantageously large enough to allow motor 50 to be inserted inside the space formed inside the annular rotors 42, 44, to minimize the height of the unit along the longitudinal axis about which rotors 42, 44 rotate.

As shown in FIG. 3, the rotor assembly 30 is mounted within the outer housing 32 on a drive axle 52 that, in the illustrated embodiment, is journaled at opposing ends of the axle on shaft bearings 54 which are advantageously mounted to walls 31, 33. The drive axle 52 of the rotor assembly 30 is axially aligned with the first and second inlets 38 and 40 of the outer housing 32. The outer housing 32 could also be equipped with only a single inlet or with more than two inlets.

The plane of the thermoelectric device 46 defines a boundary line 56 that divides the interior cavity 29 into an upper portion or supply side 58 and a lower portion or waste side 60. The first rotor 42 is located within the upper portion or supply side 58 and the second rotor 44 is located within the lower portion or waste side 60.

As shown in FIG. 3, the rotor assembly 30 further includes a first annular plate 63 that is disposed between a top edge of the thermoelectric device 46 and a bottom edge of the first rotor 42. A second annular plate 65 is disposed between a bottom edge of the thermoelectric device 46 and the top of the second rotor 44 so that the thermoelectric device 46 is interposed between the first and second plates 63 and 65. The first and second plates 63 and 65 are preferably manufactured of a material that is thermally conductive but is electrically insulative, such as, for example, alumina. In one embodiment, a heat-resistant, thermally-conductive adhesive, such as silver-filled silicon adhesive, is used to mount the first rotor 42 to the first plate 63 and the second rotor 44 to the second plate 65. Alternately, plates 63 and 65 may be omitted and the first and second rotors 42 and 44 may be directly attached to the thermoelectric device 46.

An annular, disc-like insulation member 64 of thermally insulated material extends from between the rotors 42, 44, radially outward and ends before it hits the inside of the side walls 35. Advantageously the member 64 is positioned on top of the second annular plate 65 adjacent the inner and outer periphery of the thermoelectric device 46 and is placed generally in the plane containing boundary line 56. The insulation member 64 is dimensioned to extend radially inward and outward from the thermoelectric device toward the motor 50 along the boundary line 56. A gap 66 is defined between the outer periphery of the insulation disc 64 and the interior surface of the outer housing 32, with the gap 66 forming an air bearing to reduce the passage of air across the gap 66.

Figure 4:
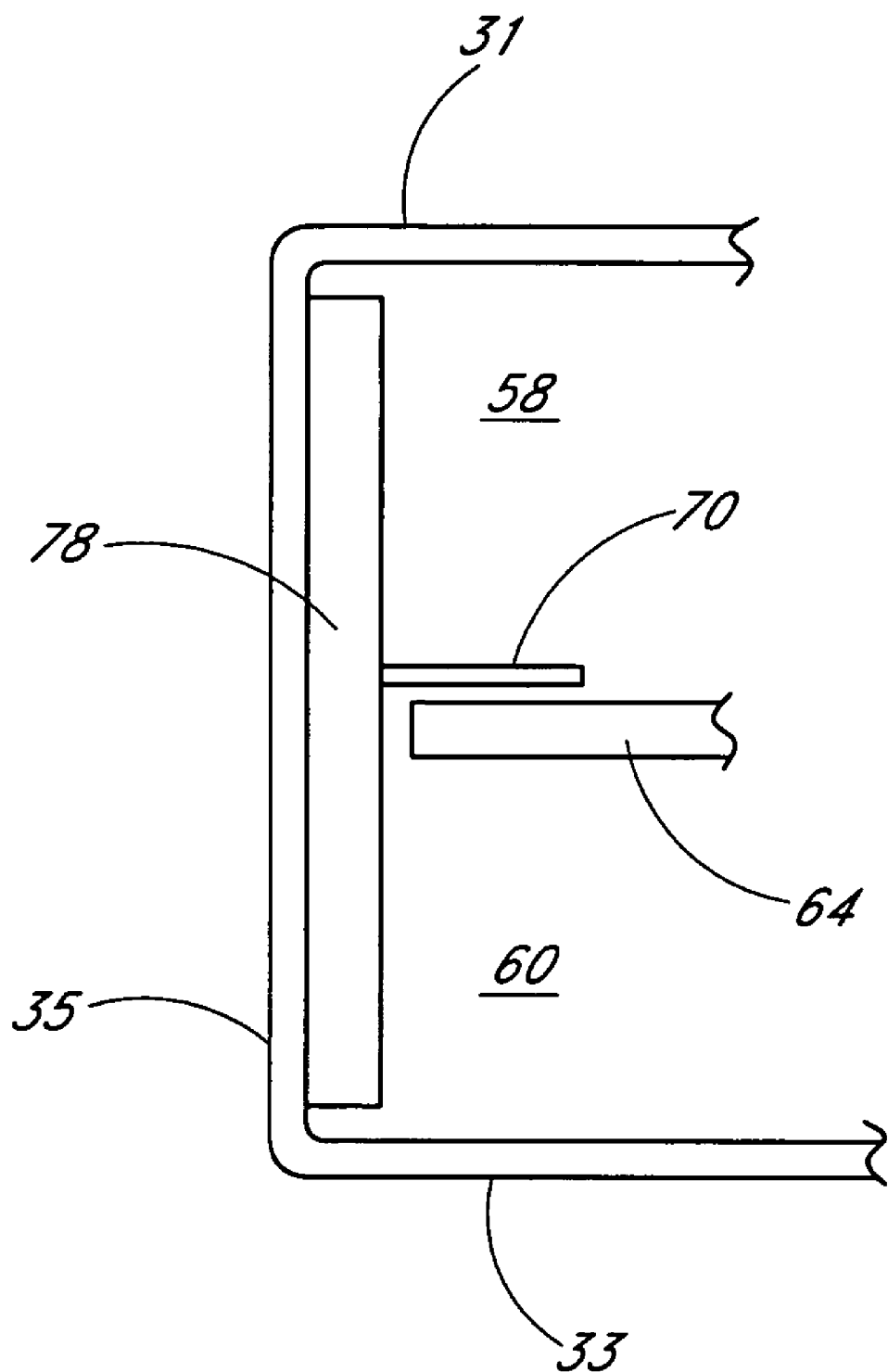
FIG. 4 is an enlarged cross-sectional view of a portion of the heat exchanger.

As shown in FIGS. 3 and 4, a thin and flexible annular seal 70 of thermally insulated material is positioned so as to extend radially inward from the interior surface of the outer housing 32 generally along the boundary line 56. The annular seal 70 is preferably sized so that it overlaps, but does not contact the adjacent surface of the insulation member 64. The annular seal 70 cooperates with the insulation member 64 to define a labyrinth seal around the outer periphery of the member 64 that thermally insulates the upper portion or supply side 58 of the interior cavity 29 from the lower portion or waste side 60 of the interior cavity 29. The insulation member 64 and annular seal 70 prevent significant heat convection between the waste and main sides. The annular seal 70 can be in the form of an air bearing that facilitates rotation of the rotor assembly 30. The insulation member 64 may comprise any of a wide variety of heat resistant, thermally-insulative materials, such as expanded polypropylene.

As illustrated in FIG. 4, at least a portion of the interior surface of the housing 32 advantageously is coated with a wicking material 78 that is adapted to absorb and conduct moisture. The wicking material 78 extends between the upper and lower portions 58, 60, and advantageously comprises a woven cotton fabric that has been texture coated to prevent microbe growth. The wicking material 78 absorbs condensed moisture expelled by centrifugal force from whichever rotor 42, 44 produces the condensation, and conducts the moisture to the other rotor where it is evaporated by the heated air—in order to avoid accumulation in the interior cavity 33 and in passages distributing the cooled air. Advantageously the wicking material 78 absorbs enough moisture to prevent accumulation in the downstream passages in fluid communication with whichever rotor 42, 44 is cooled prompting a potential for condensation.

The annular seal 70 must allow the wicking material 78 to pass. Thus, the seal 70 may be connected to an exterior surface of the material 78, may extend through the material 78 at intermittent locations, or may connect to side walls 35 at locations where the material 78 is absent. The material 70 could also extend outside of the interior cavity 33.

As seen in FIG. 3, electrically-conductive wires 80 are electrically coupled to the thermoelectric device 46 to provide an electrical potential thereto in a well known manner through brushes 84 that are in electrical communication with the rotating drive axle 52. Because electrical current must be provided to the thermoelectric device 46 in a closed circuit, two brushes 84 are in electrical communication with the axle 52 and thermoelectric 46 through brush and slip-ring assemblies known in the art. Other electrical connections, such as, for example, an inductive coupling, can be devised given the present disclosure.

Figure 5:
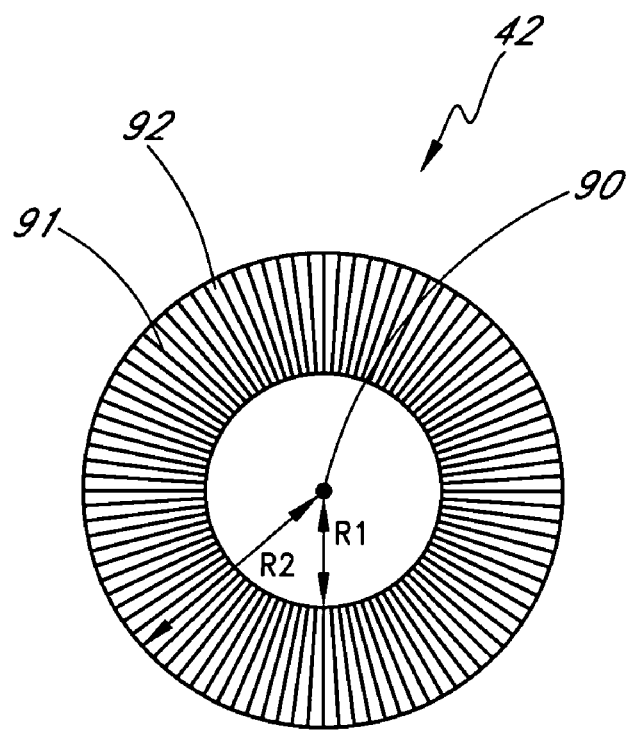
FIG. 5 is a top view of a rotor used with the heat exchanger.
Figure 6:
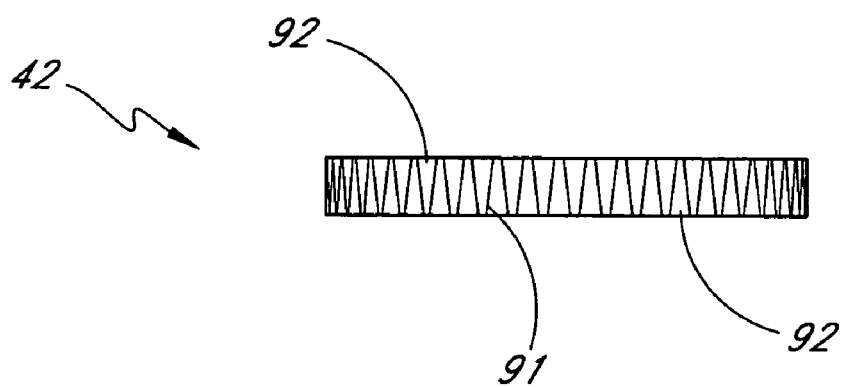
FIG. 6 is a side view of the rotor of FIG. 4.

FIGS. 5 and 6 are top and side views, respectively, of the first rotor 42. The structure of the second rotor 44 may be identical to that of the first rotor 42, although the respective dimensions may differ. The following more detailed description of the first rotor 42 is therefore equally applicable to that of the second rotor 44. The first rotor 42 comprises a strip of corrugated metal having two connected ends so that the first rotor 42 is annular in shape. The corrugations or accordion-like pleats in the first rotor 42 form a series of radially-extending fins or blades 91 that define a series of radially-extending chambers or spaces 92 therebetween. As seen in FIG. 4, the width (i.e., the circumferential distance between adjacent fins 91) of the chambers 92 gradually increases moving radially outward from a center point 90 of the first rotor 42. Each rotor 42 and 44 has an inner radius $R_1$ and an outer radius $R_2$. The spacing between adjacent fins 91 is sufficiently wide at the inner radius $R_1$ to allow air flow radially outward through the rotor 42.

In the illustrated embodiment, the blades 91 comprise generally flat walls that are connected and extend radially outward from a center point 90 on the rotational axis of the rotor 42. This design is not believed optimum from the aerodynamic viewpoint of moving the maximum volume of air through the rotor 42 for a given rotational speed or rotor size. The blades 91 may also be more aerodynamically configured to provide various airflow profiles. For example, the blades 91 may be s-shaped, c-shaped, etc. Alternately, the blades 91 may comprise any type of straight or curved surface that produces an airflow when the surfaces are rotated.

The outer radius $R_2$ preferably ranges from approximately 12–75 mm when incorporated into a temperature control system for a motor vehicle seat. The radial length of the blade 91, the difference between the inner radius $R_1$ and outer radius $R_2$, is approximately 10–40 mm when the heat exchanger 28 is incorporated into a temperature control system for a motor vehicle seat, as described below with reference to FIG. 7. The blades 91 may have a height measured along the rotational axis, in the range of approximately 6–15 mm when used with car seats. Adjacent blades 91 are preferably spaced apart a distance of approximately 0.5–2 mm for a temperature control system for a seat. The thickness of the blades 91 when made of copper or aluminum is preferably in the range of approximately 0.05–0.2 mm when incorporated into a car seat.

In an alternative embodiment, the thermoelectric device 46 is replaced by a resistive heating element which converts electrical energy into heat energy. This resistive heating element does not have the cooling capability of the thermoelectric device 46, but it does provided heated air which may have wider applicability in certain climates.

As illustrated in FIG. 3, in operation, the motor 50 rotates the axle 52 by activating the power source through a control, such as a manual switch or a thermostatically controlled switch. The motor is in driving communication with the first rotor 42, the second rotor 44, and the thermoelectric device 46 so as to rotate those components about the rotational axis of drive axle 52. The rotation of the first rotor 42 creates a pressure differential that draws air into the supply side 58 of the interior cavity 29 through the first inlet 38. The air flows into the spaces 92 and radially outward across the blades 91 of the first rotor 42. The rotation of the rotor 42 imparts centrifugal force to the air that propels the air radially outward from rotor 42 so that the air travels out of the supply side 58 of the interior cavity 29 through the first outlet 34.

In a similar manner, the second rotor 44 also rotates and draws are into the lower portion or waste side 60 of the interior cavity 29 through the second inlet 40 (or through either inlet 38 or 40 if only one inlet is provided). The air passes through the spaces 92 between the blades 91 of the second rotor 44, radially outward across blades 91, and is propelled out of the waste side 60 through the second outlet 36. The divider 64 keeps the air flows from intermingling, and because it is thermally insulated, maintains a temperature differential between the supply side 58 and waste side 60.

The electrical wires 80 also supply an electrical current to the thermoelectric device 46, advantageously through shaft 52, so that the thermoelectric device 46 heats the rotor 42 and cools rotor 44, or cools rotor 42 and heats rotor 44, depending on which direction the electrical current flows through the thermoelectric divide 46. As the air flows across the blades 91 of the first rotor 42 and the second rotor 44, the air is either heated or cooled. That is, on the hot side of the thermoelectric device 46, heat is transferred to the air from the heated fins of the rotor as the air flows thereover. On the cooled side of the thermoelectric device, heat is absorbed from the air as the air passes over the cooled rotor to thereby cool the air. The heat exchanger thus produces heated air through one outlet and cooled air through the other outlet. The heated or cooled air is then directed to the appropriate location in the seat for heating or cooling the passenger seat. The air with the undesired temperature is vented to a location where it will not noticeably affect the vehicle passengers. Preferably, the waste air is vented to a location such that the waste air is not drawn back into the outer housing 32.

The first rotor 42 and the second rotor 44 simultaneously function as fan units for generating an airflow at a predetermined pressure and also as heat exchangers for transferring heat to and from the airflow and maintaining the airflow at the desired temperature. By combining the heat exchanger function into the fan that generates the air flow, several advantages are achieved. By forming the heat exchanger into an annular fan and nesting the motor inside the heat exchanger/fan, space and weight savings are achieved.

Current systems are about 45 mm in height, which is too big for many motor vehicles and other applications requiring a small size. Newly designed systems are about 30 mm in height, but a great number of motor vehicles still have seats too small to accommodate such fans underneath or around the seat, and few can accommodate that size within the seat. Fan and heat exchanger units 28 with a height below about 20–30 mm will accommodate a majority of automotive seats, and the present invention can allow such construction. But systems 28 of the present invention having a height of about 16 mm are believed possible, which is about half the height of the smallest systems currently available, and small enough to allow the use of the heating/cooling system inside a significant majority of seat bottoms and seat backs currently used in motor vehicles. The smaller size also benefits any application where size constraints are an issue.

This height reduction represents the distance between walls 31, 33 and associated ducting to carry the air to the location within the seat. The design of rotors 42, 44 can be used to vary the dimensions, with the heat exchanger surface area of blades 91 being a compromise between blade height, blade length, and diameter, and that area must be offset by the change in performance and rotational speed of the fan. Also, shorter rotors 42, 44 can be achieved by increasing the diameter of the rotors or by operating the rotors at higher speeds, which may increase noise.

Further, the design eliminates the interconnecting ducting between the fan and the heat exchanger, saving weight, size and pressure losses in the transmitted air. The small size also allows placement of heating and cooling systems directly in the seat bottoms and backs, further reducing the need for ducting, and especially reducing the need for ducting across the pivoted joints between seat bottoms and backs. The reduced ducting and its associated pressure losses and performance degradation, also allows the use of smaller fans, which use less energy and generate less noise.

Moreover, the consolidation of several parts and functions allows a reduced manufacturing cost and an increase in efficiency of the system. The drag normally caused by passing the air over the heat exchanger is significantly reduced because the heat exchanger forms the fan blades that generate the air flow. Further, adequate heating and cooling of a motor vehicle seat are believed to use about 1000 watts less than the power needed to provide the same comfort level to a passenger using the heating and cooling system of a motor vehicle—which must heat and cool the entire passenger compartment rather than the localized environment of the seat on which the passenger sits.

A further advantage is the reduction of noise because two small fans can be used. The rotors 42 and 44 preferably operate at a rotational speed in the range of approximately 2,000–5,000 revolutions per minute, although speeds of about 1000 rpm may be desirable in some applications, and higher speeds of up to 10,000 revolutions per minute in others. The rate of airflow of the main side of the heat exchanger is in the range of approximately 2–6 cubic feet per minute at a pressure of about 0.2–1 inches of water, with a flow rate of about 3–4 cfm being preferred. The rate of airflow of the waste side of the heat exchanger is in the range of approximately 2–10 cubic feet per minute, at a pressure of about 0.3–0.4 inches of water. The rotors 42, 44 with the blades acting as conductive heat exchanger as well as fan blades to move air, provide these needed air flows. In typical automobile use, 12 volt motors drive the rotors 42, 44. This fan flow rate and pressure are smaller than in prior seat systems where the fan had to generate enough pressure and air flow to provide air to both the bottom and backrest portions of the seat.

To further enhance the above advantages, in a further embodiment the blades 91 may comprise a series of independent walls mounted on an annular plate where the blades 91 are contoured or curved to provide a preselected airflow profile when the first rotor 42 rotates, advantageously a profile that is more efficient than the straight blades 91 described above while still conducting heat well and maintaining a low manufacturing cost. Further, the blades 91 as illustrated and described above are not optimized for minimizing noise, and noise reduction is an important consideration for equipment operating inside the passenger compartment of motor vehicles. A more refined design of the blades 91 could advantageously reduce noise. It is believed that the level of noise generated by rotation of the rotors 42 and 44 generally decreases as the number of blades 91 increases. To accommodate the thermal transfer use of the rotor blades 91, more blades are likely to be required than may be desirable for optimum performance if the rotors 42, 44 were designed solely for use as fans to move air—without regard to the heat transfer function and noise of the rotors 42, 44.

The compact design also reduces the weight of the unit. As mentioned, the blades 91 are preferably manufactured of a thermally conductive material, such as pure annealed aluminum, carbon, and copper, which are known to be highly thermally conductive materials. Other material may be used as scientific advances in conductive material are made. While copper is heavier than aluminum, its increased thermal conduction properties offer advantages and design options in configuring the rotor blades 91 to perform both heat transfer and air movement functions. The blades preferably have a thermal conductivity rate of greater than about 12 w/m·° K.

The conditioned air that flows out of the first and second outlets 34 and 36 may be put to any of a wide variety of uses. In one embodiment, the heat exchanger 28 is incorporated into a ventilation system for vehicle seats, such as for automobiles, as described below with reference to FIG. 7. It will be appreciated that the heat exchanger 28 could also be used in other applications as well.

Figure 7:
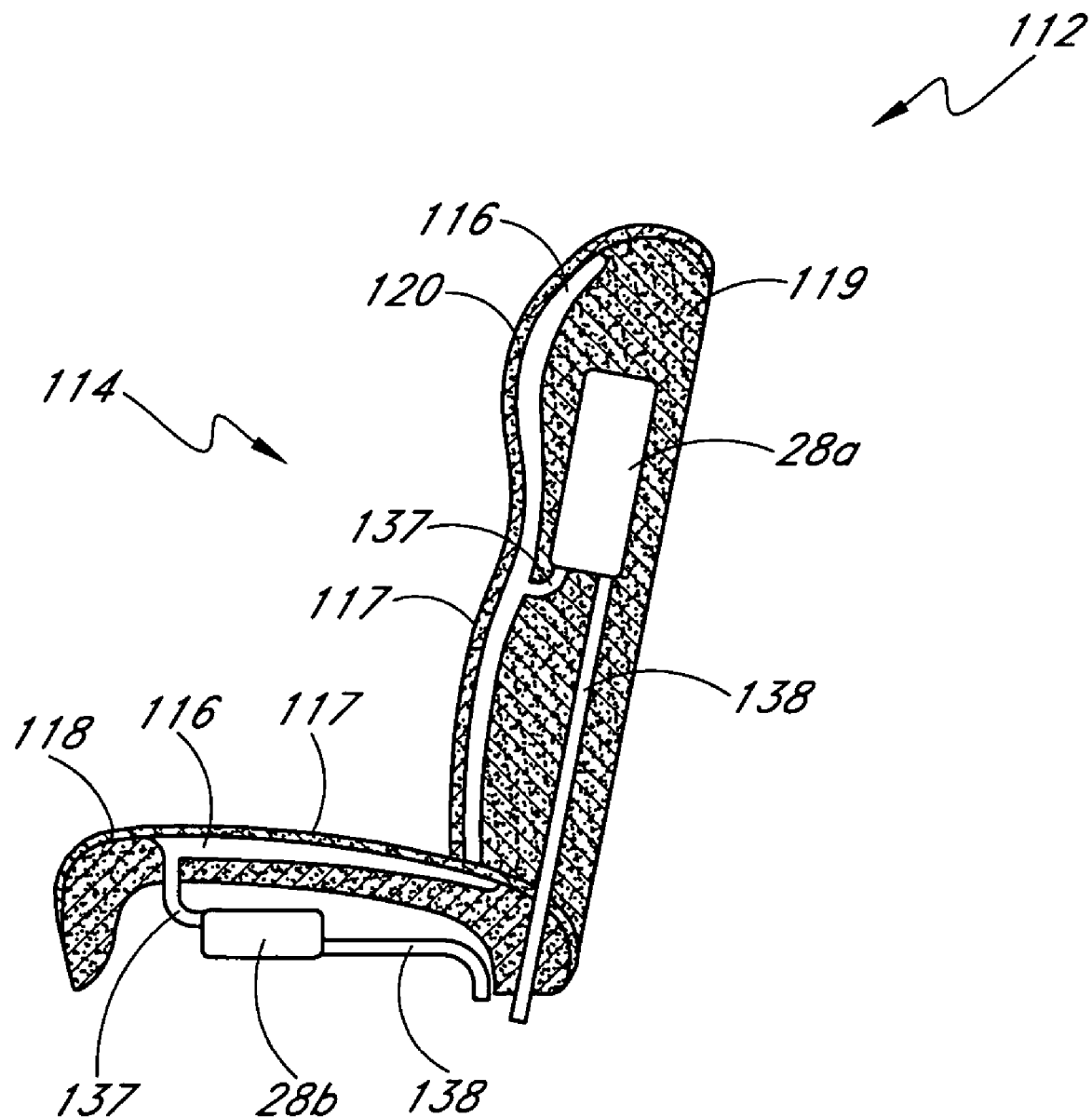
FIG. 7 is a schematic view of a seat temperature control system incorporating the heat exchanger of the present invention.

As illustrated in FIG. 7, an automobile seat temperature control system 112 comprises at least one seat 114 and a pair of heat exchangers 28a and 28b (referred to collectively as "heat exchangers 28") mounted therein. The heat exchangers 28 are of the type described above with reference to FIGS. 1–6. In the illustrated embodiment, the first heat exchanger 28a is mounted within a seat bottom 118 and the second heat exchanger 28b is mounted within a seat back 120. The heat exchangers may also be mounted adjacent any portion of the seat 114, such as below or on the side of the seat 114.

The seat 114 has a series of channels 116 for the passage of air. An outer covering 117 of the seat 114 surrounds a padding layer 119 through which the channels 116 extend. The outer covering 117 is desirably perforated or air-permeable to allow air to flow therethrough from the channels 116. The seat 114 also includes seat bottom 118 and seat back 120 extending upwardly therefrom for supporting a human body in a sitting position. The outer covering 117 may comprise any well known material for covering seats, such as perforated vinyl, cloth, perforated leather, etc. The padding layer of the seat 114 may comprise any well-known material for enhancing user comfort, such as reticulated foam.

As illustrated in FIG. 7, the first outlet 34 (FIG. 1) of the first heat exchanger 28a is attached to channels 116 that extend through the seat back 114. The first outlet 34 of the second heat exchanger 28 is attached to the channels 116 that extend through the seat bottom 118. Each of the heat exchangers 28 is electrically coupled to a power source via a control switch so that a user may selectively power the heat exchangers via the power switch. A control switch is also coupled to the heat exchangers 28 for reversing the polarity of the electrical current applied to the heat exchangers 28 in a well known manner. The control switch is used to switch the heat exchangers 28 between a heating and a cooling mode. In the heating mode, the heat exchangers 28 pump heated air into the seat 114. In the cooling mode, the heat exchangers pump cooled air into the seat 114. The heat exchangers 28 may also be coupled to separate power and temperature controllers for providing independently-controlled conditioned airflow to the seat back 114 and the seat bottom 120.

A feedback control system including a temperature sensor, such as a thermocouple, may also be provided. The system 112 may also be equipped with a control system for varying the speed of the rotors 42 and 44 to vary the flow rate. Those skilled in the art will appreciate that any of a wide variety of control devices may also be provided.

The channels 116 may comprise a series of plastic ducts or pipes that are coupled to at least one of the first and second outlets 34, 36 of the heat exchangers 28 and disposed within the seat 114. Advantageously, the ducts may be formed by heat sealing the plastic foam of which the seat is made, or by coating the duct with a sealant to reduce air loss through the duct. The channels could also comprise air gaps within a permeable material, such as reticulated foam, that allow air to flow therethrough. Additionally, the channels may comprise any type of passage for the flow of air, such as ducts, pipes, small holes, etc.

Preferably, a main duct 137 is connected to the first outlet 34 for routing the cooled or heated air to the seat 114 surface 117 via the channels 116. A waste duct 138 is connected to at least the second outlet 36 for routing the unwanted "waste" air to the outside environment away from the passenger occupying seat 114.

In operation, the power switch is activated to supply an electrical current to the heat exchangers 28. As discussed above, the thermoelectric device 46 and the main and second rotors 42 and 44 combine to generate a flow of heated or cooled air which is routed to the main ducts 137 and throughout the seat 114. The conditioned air flows out of the channels 116 through the permeable outer covering 117 to thereby cool or heat the occupant of the seat 114. Desirably, the waste air is routed away from the seats 114 through the waste ducts 138.

The waste ducts 138 can advantageously vent below the seat bottom 118 because the heating and cooling system in the passenger compartment can produce typically over 20 times the amount of heat or cool air as is exhausted through waste duct 138. As long as the waste ducts 138 do not vent directly on a passenger, toward a passenger, or on the inlets 38, 40 the environmental heating and cooling equipment will amply dissipate the output from waste ducts 138. A waste duct 138 connecting unit 28a located in the back portion 119 can vent below the seat bottom 118 without having a duct extend across the pivoted joint between the bottom portion 118 and backrest 119. Because the airflow of waste duct 138 is downward toward the seat bottom 118, two aligned openings, one at the bottom of back portion 119, and one in the seat bottom 118, are sufficient to convey the air to below the seat bottom 118.

Figure 8:
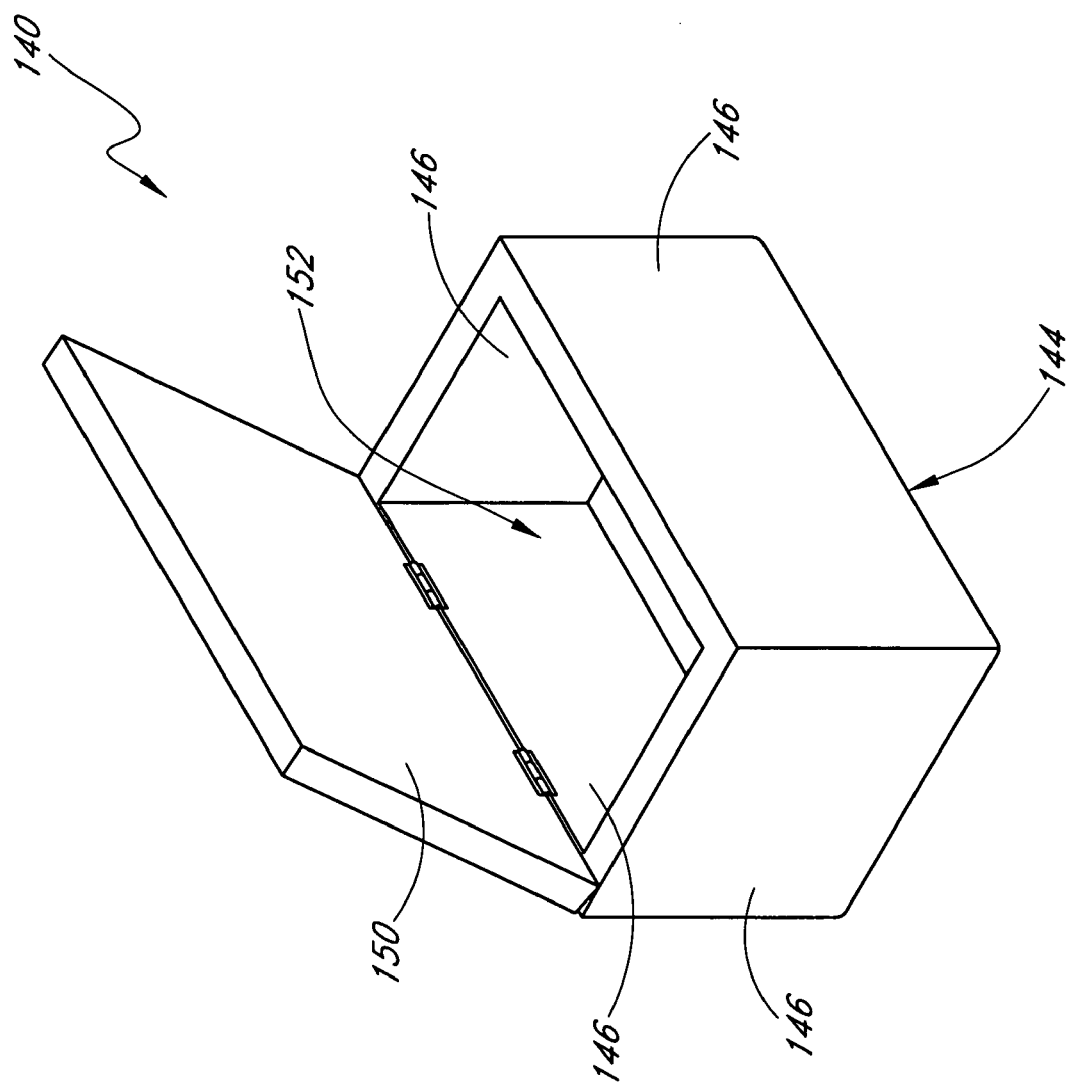
FIG. 8 is a perspective view of a cooler box that incorporates the heat exchanger.

As shown in FIG. 8, in another embodiment, the heat exchanger 28 is incorporated into a cooler, such as an ice chest 140. In the illustrated embodiment, the ice chest 140 comprises a rectangular box that includes a base wall 144 and four side walls 146 extending upwardly therefrom. A lid 150 is pivotably mounted on the four side walls 146 in a well known manner to provide access to a storage space 152 defined by the walls of the ice chest 140. The walls of the ice chest are desirably insulated in a well known manner to maintain the temperature of the storage space 152.

Figure 9:
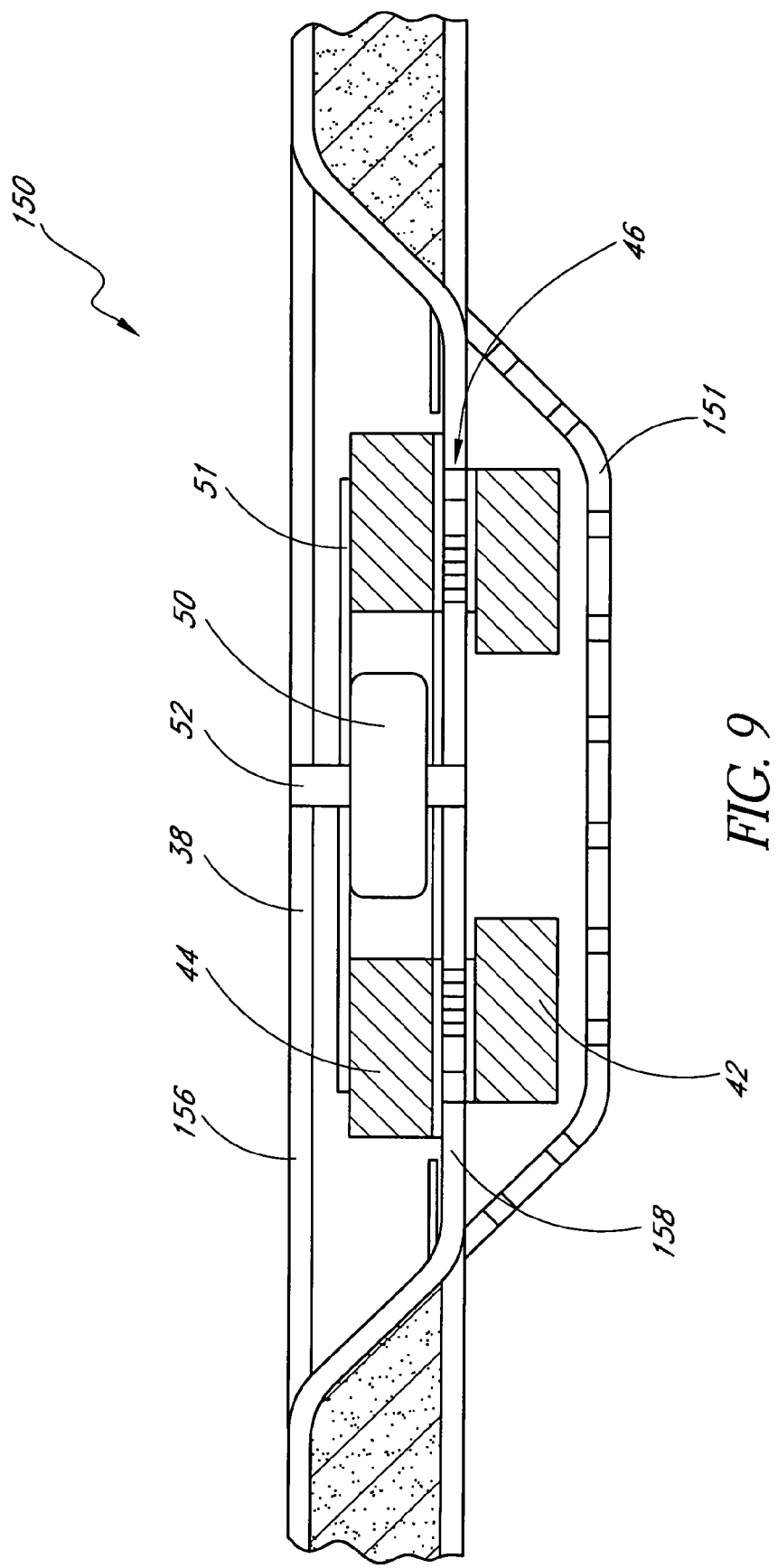
FIG. 9 is a cross-sectional side view of a lid of the cooler box of FIG. 8.

FIG. 9 is a cross-sectional side view of the lid 150 of the ice chest 140. At least one heat exchangers 28 of the type described above with reference to FIGS. 1–6 is disposed within the lid 150. The heat exchanger 28 is connected to a power source (not shown), such as a battery of the proper voltage and power, and is configured to operate in a cooling mode such that it outputs a flow of cold air at the first fan 42, as described above. The heat exchanger 28 is rotatably mounted within the lid 150 such that the waste side of the heat exchanger 28 is positioned between top and bottom walls 156, 158, respectively, with an insulation member positioned to thermally separate the main and waste sides. The main side of the heat exchanger 28 is disposed immediately below the bottom wall 158. A cover unit 159 is positioned over the main side of the heat exchanger 28. The cover unit 159 includes a series of apertures to allow air to flow through the main side of the heat exchanger 28. The main side of the heat exchanger 28 is positioned within the storage space 152 of the ice chest 140 when the lid 150 is closed.

The waste side of the heat exchanger 28 is disposed between the top and bottom walls 156 and 158 of the lid 150. An inlet 38 extends through the top wall 156 to allow air to flow into and out of the heat exchanger 28. The lid 150 is preferably filled within insulative material around heat exchanger 28.

In operation, the heat exchanger 28 is powered in the cooling mode so that the first fan 42 generates a flow of cooled air within the storage space 152 when the lid 150 is closed. In this manner, the storage space 152 is maintained at a relatively cool temperature. The heated waste air is routed to the outside environment such as through an outlet in the top wall 156 of the lid 150. Any of a wide variety of articles, such as food, may be stored within the storage space 152.

Figure 10:
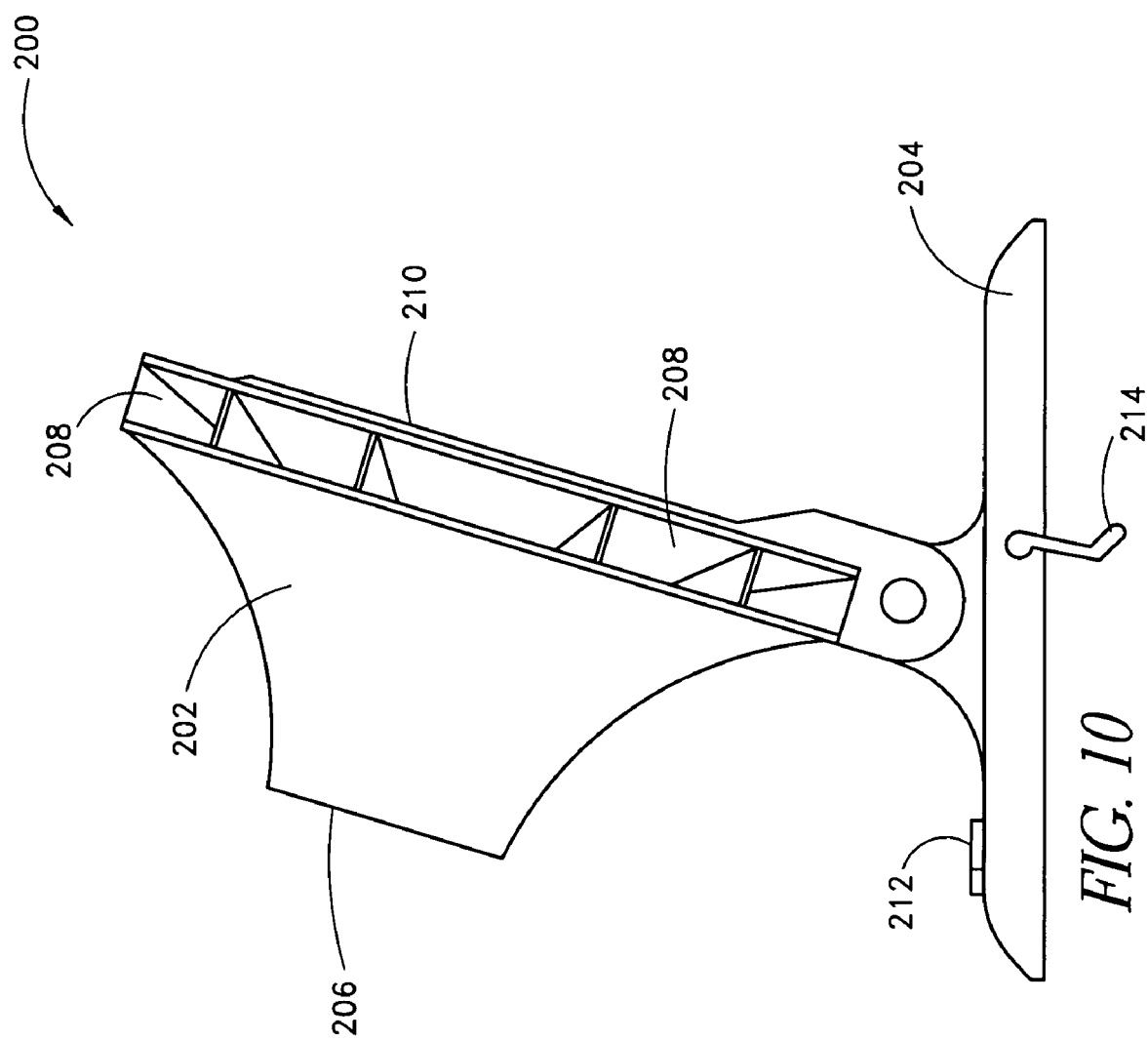
FIG. 10 is a side view of a fan unit incorporating the heat exchanger of the present invention.

With reference to FIG. 10, there is shown a fan unit 200 that is configured to be mounted adjacent or within a standard desk. The fan unit 200 includes a housing 202 that is pivotably mounted to base 204. The housing 202 is substantially cylindrical shaped and includes a conditioned air outlet 206 and one or more waste air outlets 208 around the periphery of the housing 202. An air inlet 210 is located in the housing 200 opposite the conditioned air outlet 206. A control switch 212 and a power cord 214 are coupled to the base 204 for selectively powering the fan unit 200 and/or the thermoelectric element 232 in a well known manner.

Figure 11:
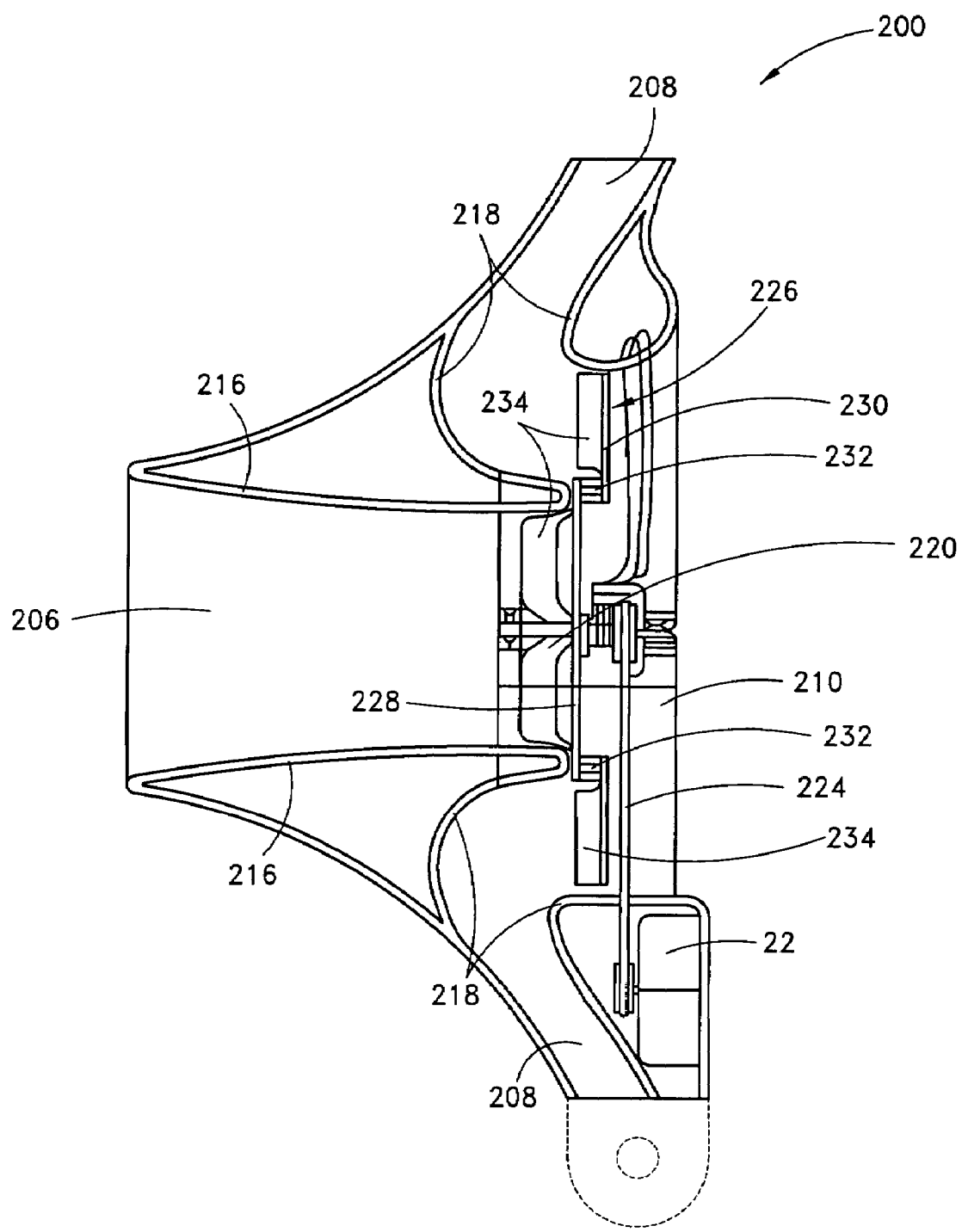
FIG. 11 is a side cross-sectional view of the fan unit of FIG. 10.

FIG. 11 is a cross-sectional view of the fan unit 200. An annular duct 216 is disposed within the housing 202 and defines the conditioned air outlet 206. A second duct 218 defines the waste air outlets 208. A drive axle 220 is rotatably mounted within the housing so as to be axially-aligned with the conditioned air outlet 206. In the illustrated embodiment, a motor 222 is drivingly coupled to the drive axle 220 via a drive belt 224. A rotor assembly 226 is mounted to the drive axle 220 so that the rotor assembly rotates with the drive axle 220.

The rotor assembly 220 comprises a main fan 228 adjacent the conditioned air outlet 206 and an annular waste fan 230 on the side of the main fan 228 opposite the conditioned air outlet 206. A thermoelectric element 232, such as a Peltier heat exchanger, is interposed between the main and waste fans 228 and 230. The main fan 228 has a circumference that is less than or equal to the circumference of the conditioned air outlet 206 so that the main fan is configured to cause air to flow through the conditioned air outlet 206. The waste fan 230 is positioned so to communicate with the waste outlet 208. The main and waste fans 228 and 230 may comprise any type of device that is configured to produce an air flow upon rotation. In one embodiment, the fans comprises flat discs having louvers 234 punched therethrough. The fans are preferably manufactured of a highly thermally conductive material.

In operation, the motor 22 is powered through a power source (not shown) in a well known manner. The thermoelectric device 232 cools the main fan 228 and heats the waste fan 230 (or vice versa) in the manner described above with respect to the previous embodiments. The fans also rotate to produce a flow of conditioned and waste air through the conditioned air outlet 206 and the waste air outlet 208, respectively. The air may be routed to cool a desired location, such as beneath a desk. If desired, ducts, hoses and other devices may be connected to the outlets to further direct the flow of air therefrom.

Figure 12:
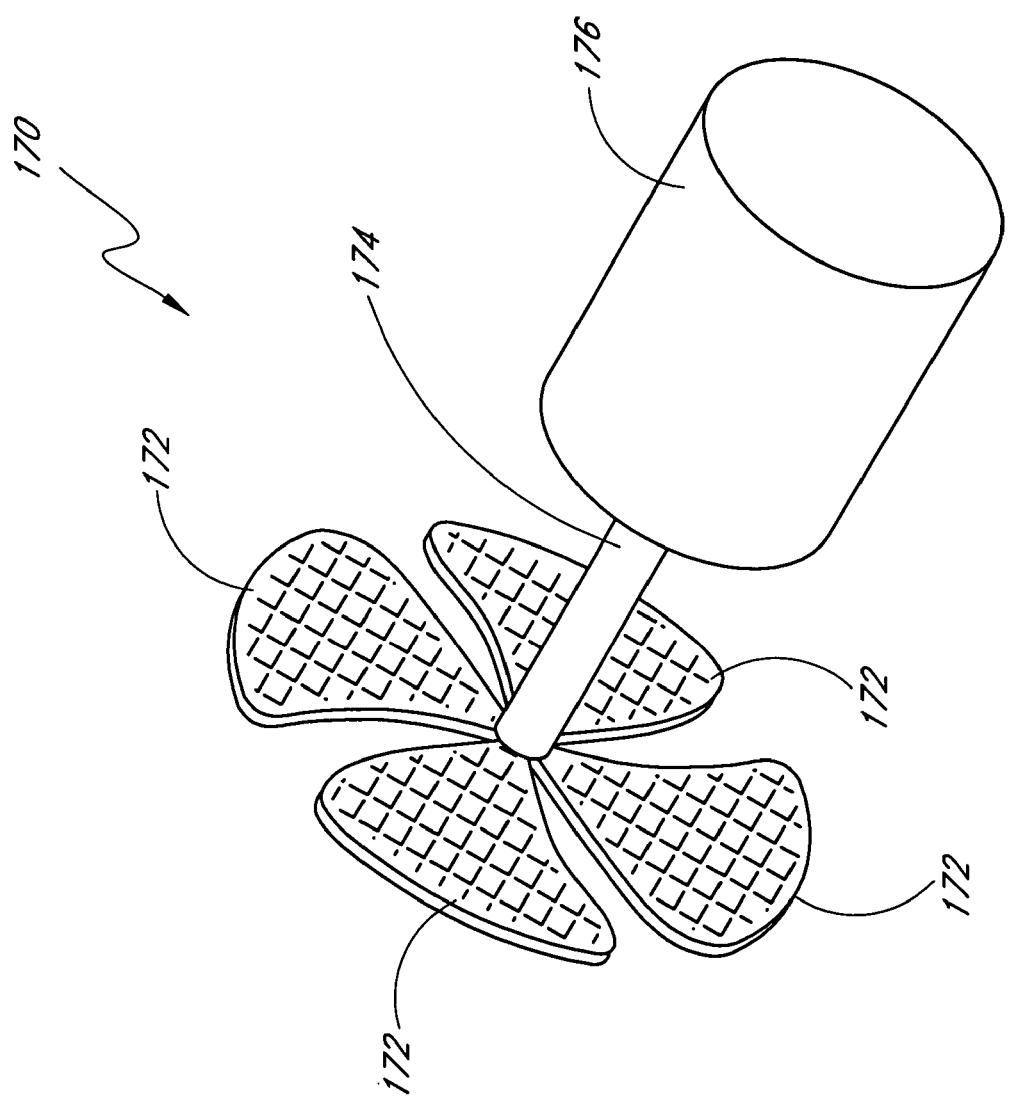
FIG. 12 is a perspective view of another embodiment of the heat exchanger.

FIG. 12 shows another embodiment of a heat exchanger comprising a fan unit 170 having a plurality of air flow generating members, such as blades 172, that rotate about an drive axle 174. A motor 176 is drivingly connected to the axle 174, either directly or indirectly, such as through a gear mechanism. One or more electrical heat generating devices, such as electrical resistors 180, are mounted on the blades 172. The resistors may be embedded within the blades 172 or may be painted thereon, such as with adhesive.

In operation, the resistors 180 are heated by applying an electrical current thereto and the axle 174 is rotated via the motor 176. The blades 172 generate an airflow, which is heated by the resistors through a convective process. The fan unit 170 is thereby used to generate a heated airflow.

Given the above disclosure, other variations of this invention will be known to those skilled in the art. For example, the rotors 42, 44 are shown connected to the rotating shaft 52 by plate 51 located adjacent the first or upper wall 31. In this configuration the interior cavity formed by the inner diameters of rotors 42, 44 are interconnected. It is believed possible to have the plate 51 contoured to the exterior shape of the top portion of motor 50 and then extend radially outward at about the plane containing the thermoelectric 46. That would place a physical separation between the air flows entering rotors 42 and 44. It is also believed possible to form the housing of motor 50 with a radial flange extending radially outward at about the plane containing boundary line 56, with the motor 50 rotating, and thus provide a physical separation between the air flows entering the rotor 42 and 44.

Enhanced embodiments of a thermoelectric heat exchanger which could be used in conditioned air seats and many other localized conditioned air applications are shown in FIGS. 13–18.

Figure 13A:
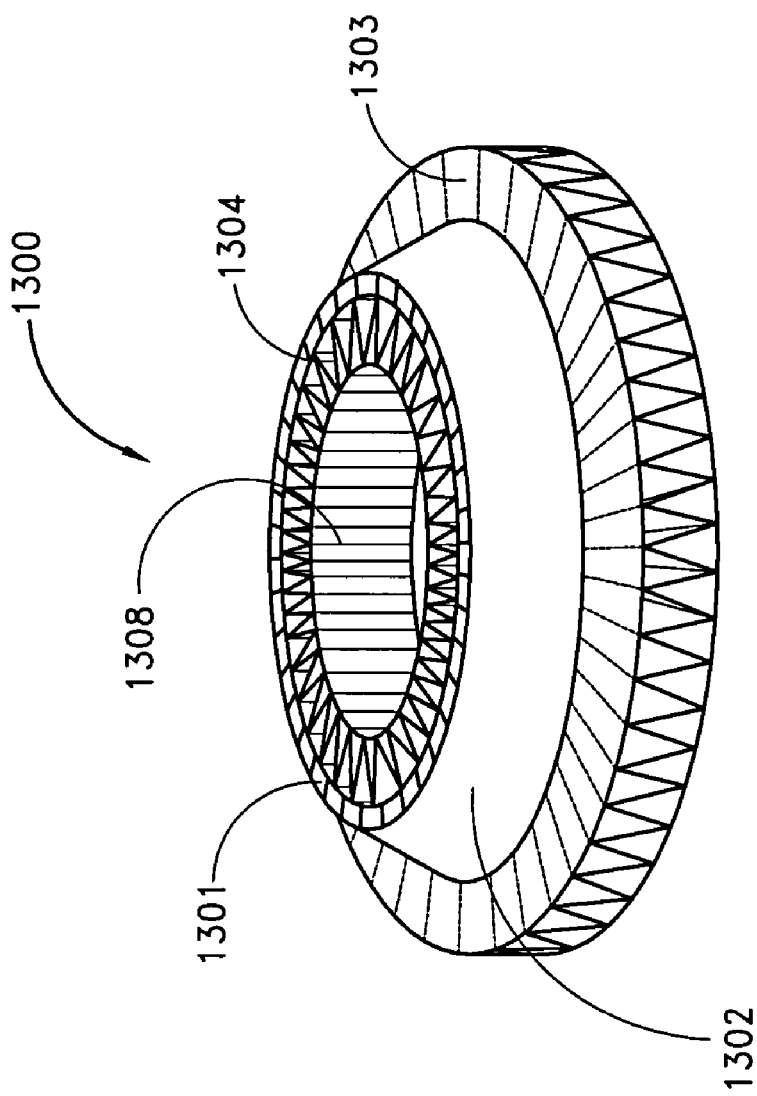
FIG. 13 illustrates an embodiment of a rotary thermoelectric heat exchanger.
Figure 13B:
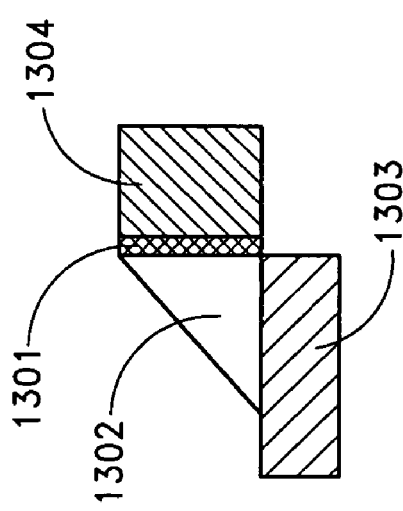
Figure 13C:
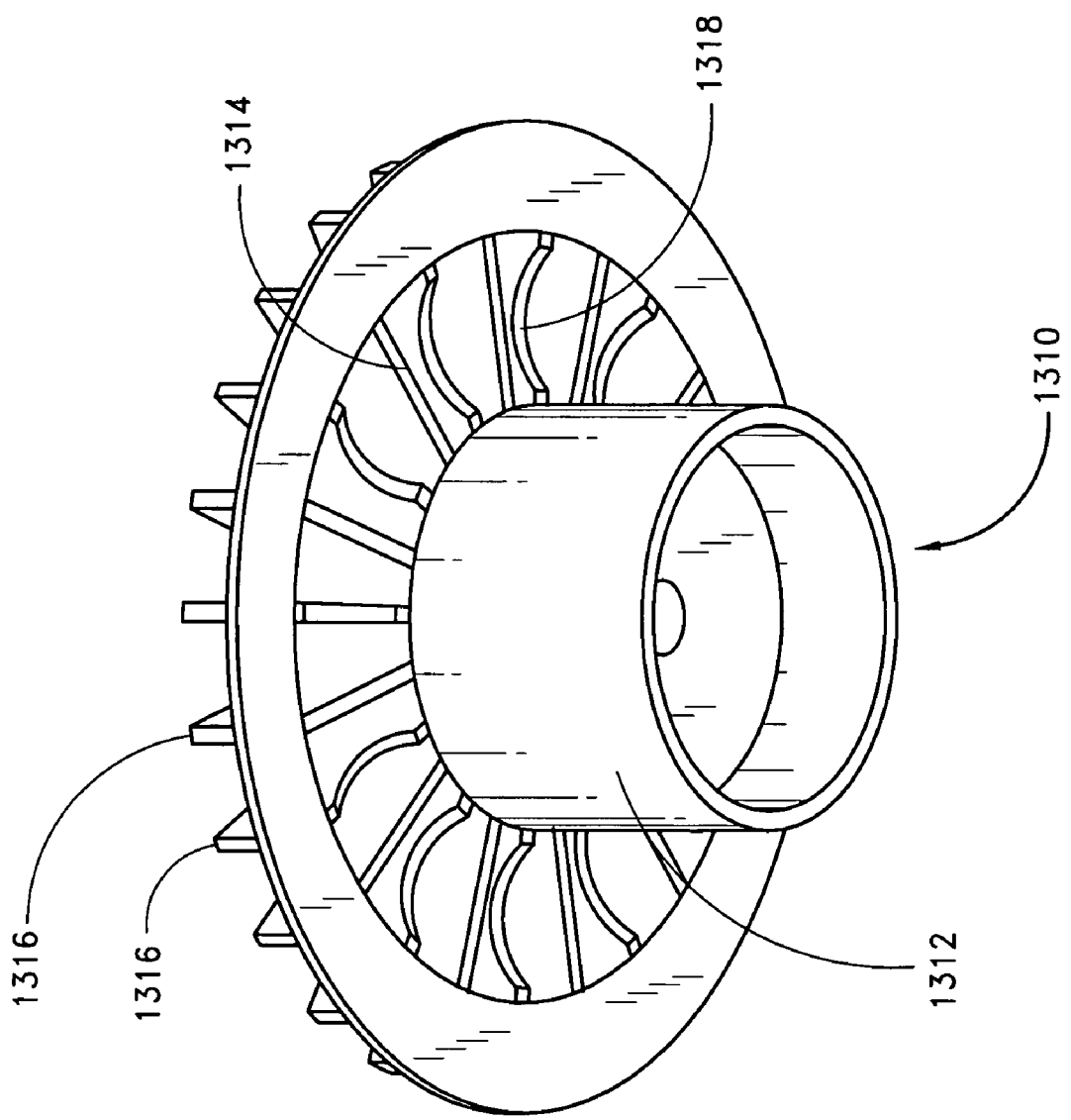
Figure 13D:
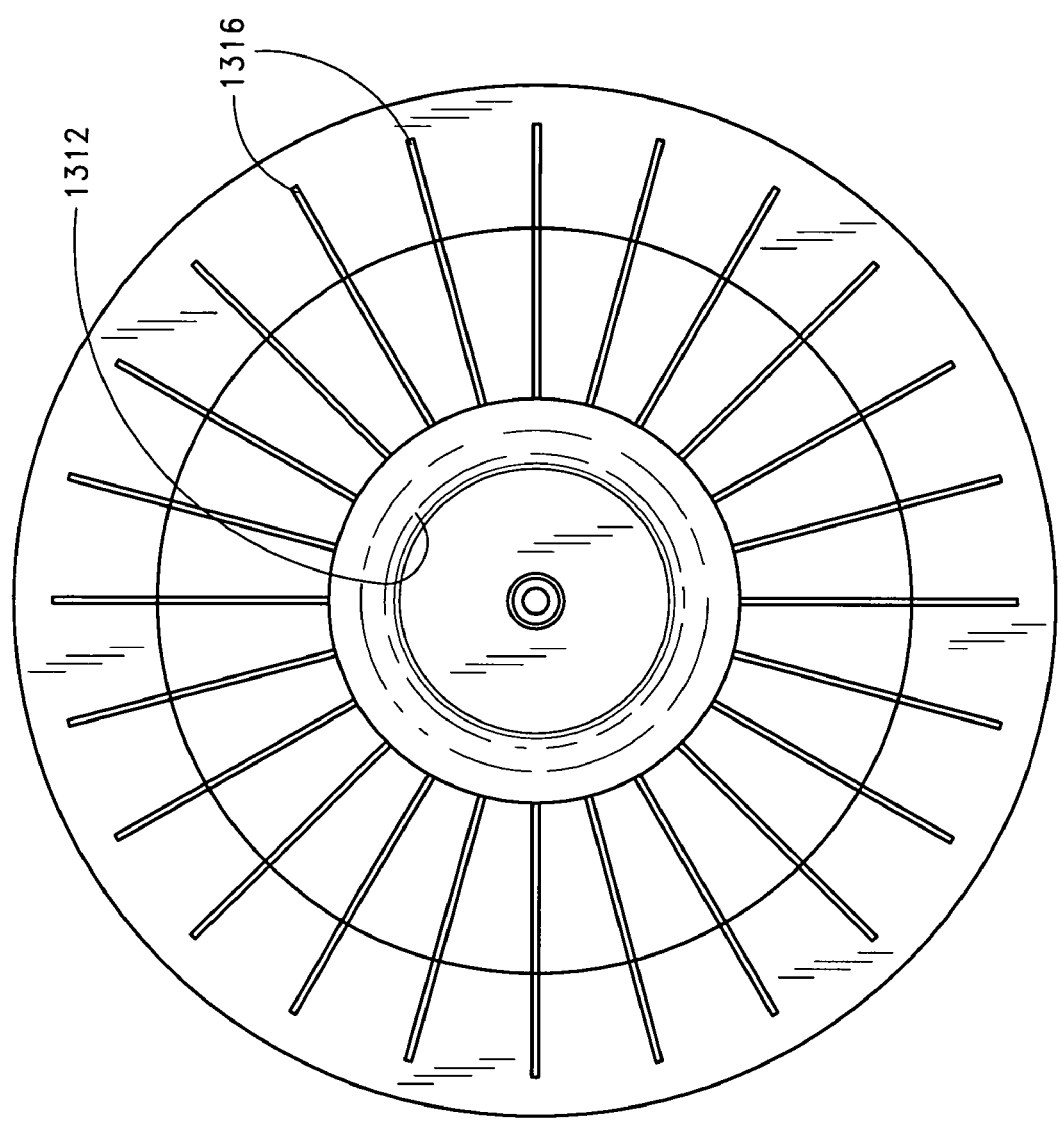

A first embodiment of an enhanced thermoelectric heat exchanger 1300 is shown in FIG. 13A. FIG. 13B depicts a cross-section of the rotary heat exchanger 1300. FIG. 13C depicts an auxiliary fan blade insert 1310 for the heat exchanger 1300. FIG. 13D depicts a top view of the thermoelectric heat exchanger 1300 with the auxiliary fan 1310 in place. A thermoelectric device 1301 is attached so as to be in uniform and good thermal contact with a heat transfer member 1302. A heat transfer fin array forming a first heat exchanger 1303 is in uniform and good thermal contact with the heat transfer member 1302. The opposite side of the thermoelectric device 1301 is in uniform and good thermal contact with a second heat exchanger 1304. In an alternative embodiment, a second heat transfer member (not shown) may be provided to conduct heat to the second heat exchanger 1304. In the depicted embodiment, the thermoelectric device 1301 is arranged in a cylindrical form. Similarly, the heat transfer member 1302, and heat exchangers 1303, 1304 are cylindrical in form. All are formed about a central axis. The heat exchanger array 1303 is oriented so that as the assembly spins, fluid (not shown) is ducted in a generally outward direction (or away from the central axis). The heat exchanger 1304 is oriented so that fluid passes along the axis of rotation of the assembly.

The thermal contacts can be made by any means that provide uniform thermal contact with low thermal resistance. Some Examples are braised, soldered, thermally conductive glue or thermally conductive grease joints. Alternately, the thermoelectric elements and the thermoelectric device may be integral with each other to achieve simplicity of manufacture, lower costs, reduce number of parts, improve thermal heat transfer or to achieve other advantages. For example, the fin array 1303 could be machined from an extension of the heat transfer member 1302 or the thermoelectric elements could be soldered to a suitable circuit pattern formed directly on a high thermal conductivity, electrical insulation layer on the heat transfer member.

FIG. 13C depicts the auxiliary fan 1310 for the heat exchanger 1300. The mounting hub 1312 of auxiliary fan 1310 may be inserted into the top of the central cylinder 1308 of the heat exchanger 1300. In this manner, an annular gap or ring 1314 matches up with the upper exits of the heat exchanger 1304 blades. The auxiliary fan 1310 has fan blades 1316 which are configured to operate in conjunction with the heat exchanger fins 1304. The fan hub's 1312 outside diameter is sized to be less that the inside diameter of the heat exchanger 1304. Thus, the auxiliary fan hub 1312 fits within the heat exchanger 1300. Preferably, the auxiliary fan blades 1316 extend outward above the heat exchanger 1304, as depicted in the top view of the auxiliary fan 1310 in place with the heat exchanger 1300 of FIG. 13D. As assembled, when the assembly rotates, the auxiliary fan blades 1316 act to move fluid outward or away from the axis of rotation. This action draws the fluid through the heat exchanger 1304 along the axis of rotation and outward along the auxiliary fan blades 1316. An assembly view in a housing will be explained in further detail in FIG. 14. Preferably, some of the auxiliary fan blades 1316 have cut-outs 1318 to facilitate increased airflow from the heat exchanger 1304 through the open ring 1314 and radially outward along the fan blades 1316.

Figure 14:
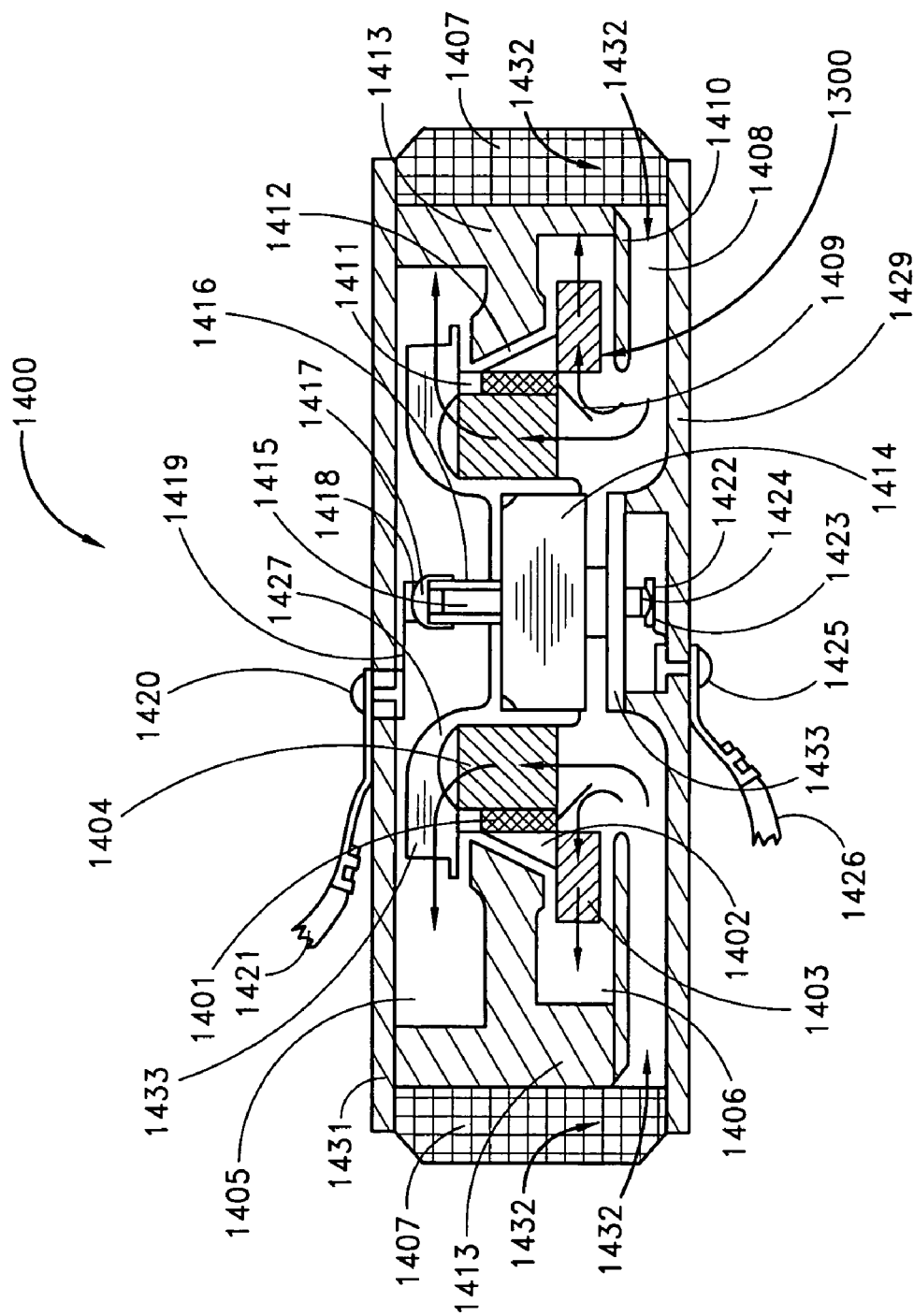
FIG. 14 depicts the embodiment of a rotary thermoelectric heat exchanger of FIG. 13 in a housing.

FIG. 14 depicts a preferred embodiment of the rotary thermoelectric heat exchanger assembly 1400 having a heat exchanger 1300 with auxiliary fan, a motor and a housing. The thermoelectric device 1401, heat transfer member 1402 and heat exchangers 1403 and 1404 are as described in FIGS. 13A and 13B, and form the rotating heat exchanger 1300. The heat exchanger 1304 is attached to an auxiliary fan 1427 and the motor rotor 1414 of an electric motor. The auxiliary fan 1427 corresponds to the auxiliary fan of FIG. 13C. The motor rotor 1414, fan assembly 1427 and rotating heat exchanger 1300 rotate as a unit. A filter 1407 surrounds the assembly fluid chamber 1408 formed by an outer wall 1429 and an inner wall 1410. A flow directing member 1409 attached to the thermoelectric array 1401 guides fluid flow. Fan blades 1433 are part of the rotating auxiliary fan 1427. A motor rotor 1414 and the thermoelectric array are attached to the auxiliary fan 1427. A fluid chamber 1405 is formed by a wall 1431 and an insulator 1413. A second chamber 1406 is formed by the insulator 1413 and the inner wall 1410.

A contact 1424 is attached to the shaft 1415 of the motor rotor 1414 and mates with a stationary contact 1422. An electrical wire and terminal assembly 1426 is attached to a rivet 1425 thence to a contact leaf 1423 and the contact 1422. A second contact 1417 is insulated from the shaft 1415 by an electrically insulating sleeve 1416. The contact 1417 mates with a contact 1418 that is attached to a contact leaf 1419 which, in turn, is in contact with a rivet 1420, and thence, to a terminal assembly 1421.

The motor rotor 1414 rotates on the motor base 1433 at a suitable velocity to draw fluid 1432 through the filter 1407 and radially inward through the duct 1408. A first part of the fluid passes around the inner edge of the inner wall 1410 and through the heat exchanger 1403 and into the fluid chamber 1406. A second portion of the fluid 1432 passes through the second heat exchanger 1404 and thence through the fan blades 1433 and to the fluid chamber 1405. The fluids in the chambers 1405 and 1406 have been pressurized by the fan assembly 1427. Electric current passes from the terminal assembly 1421 through the stationary contact 1418 to a contact 1417 that is electrically isolated from the shaft 1415. The circuit of the thermoelectric array 1401 is connected to the contact 1417 and to the shaft 1415 so that current from the terminal assembly 1421 passes through the rotating thermoelectric assembly 1401 and to the shaft 1415. The contact 1424 is electrically connected to the shaft 1415 and mates with the stationary contact 1422. Current from the shaft 1415 passes through the contacts 1424 and 1422 the contact leaf 1423 the rivet 1425 to the terminal assembly 1426 completing the system circuitry.

The thermoelectric device circuitry is such that current flow in once direction causes the inner side of the thermoelectric device to become hot and the outer side to become cold. When the current is reversed, the inner side becomes cold and the outer side becomes hot. In the first case, the outer side of the thermoelectric device 1401 cools the heat transfer assembly 1402 due to thermal conduction; thence the heat exchanger fin array 1403 and the fluid 1432 being pumped to the fluid chamber 1406 are cooled. Advantageously, the heat exchanger 1403 comprises a fin array or other blade based heat exchanger. The fluid 1432 collected in the fluid chamber 1406 is thus cooled, and pressurized, and exits through an opening (not shown) where it can be used as a cooling medium. Similarly, the second portion of the fluid is heated by passing through the heat exchanger 1404 that has been heated by the hot side of the thermoelectric device 1401. Advantageously, the heat exchanger 1304 comprises a fin array or similar blade based heat exchanger. The hot fluid 1423 is pumped to high pressure by the rotating fan blades 1433 and collects in the fluid chamber 1405. The heated fluid 1432 exits through a port (not shown) as a source of heated fluid. Alternately, it is exhausted as waste heat, if cooling alone is required.

By reversing the direction of current flow, hot fluid will collect in the fluid chamber 1405 and cold fluid will collect in the fluid chamber 1406. The rotational speed of the heat exchanger assembly and the current can be varied to achieve different pressures, fluid flow rates, and chamber temperatures.

Preferably, the insulator 1413 is designed to form an effective labyrinth seal where it is in proximity to the heat transfer array 1402 at 1412. Convective heat transfer from the hot side to the cold side of the thermoelectric array preferably is further reduced by the inclusion of a thermally insulative seal 1411. Preferably, the flow directing member 1409 is designed to keep fluid 1432 prior to entering the heat exchanger arrays, 1403 and 1404, from stirring and thereby convectively transporting heat content from one array to the other.

The filter 1407 serves to remove particles and other contaminants from the fluid stream. For example, if the fluid is air containing hydrocarbon contaminants, the contaminants can be removed by incorporating activated charcoal or other suitable agent in the filter media. Similarly, the filter can have layers of various porosity to remove particulates of different sizes at several locations within it, so as to increase capacity, lower pressure drop across the filter and achieve high filtration efficiency.

Figure 15:
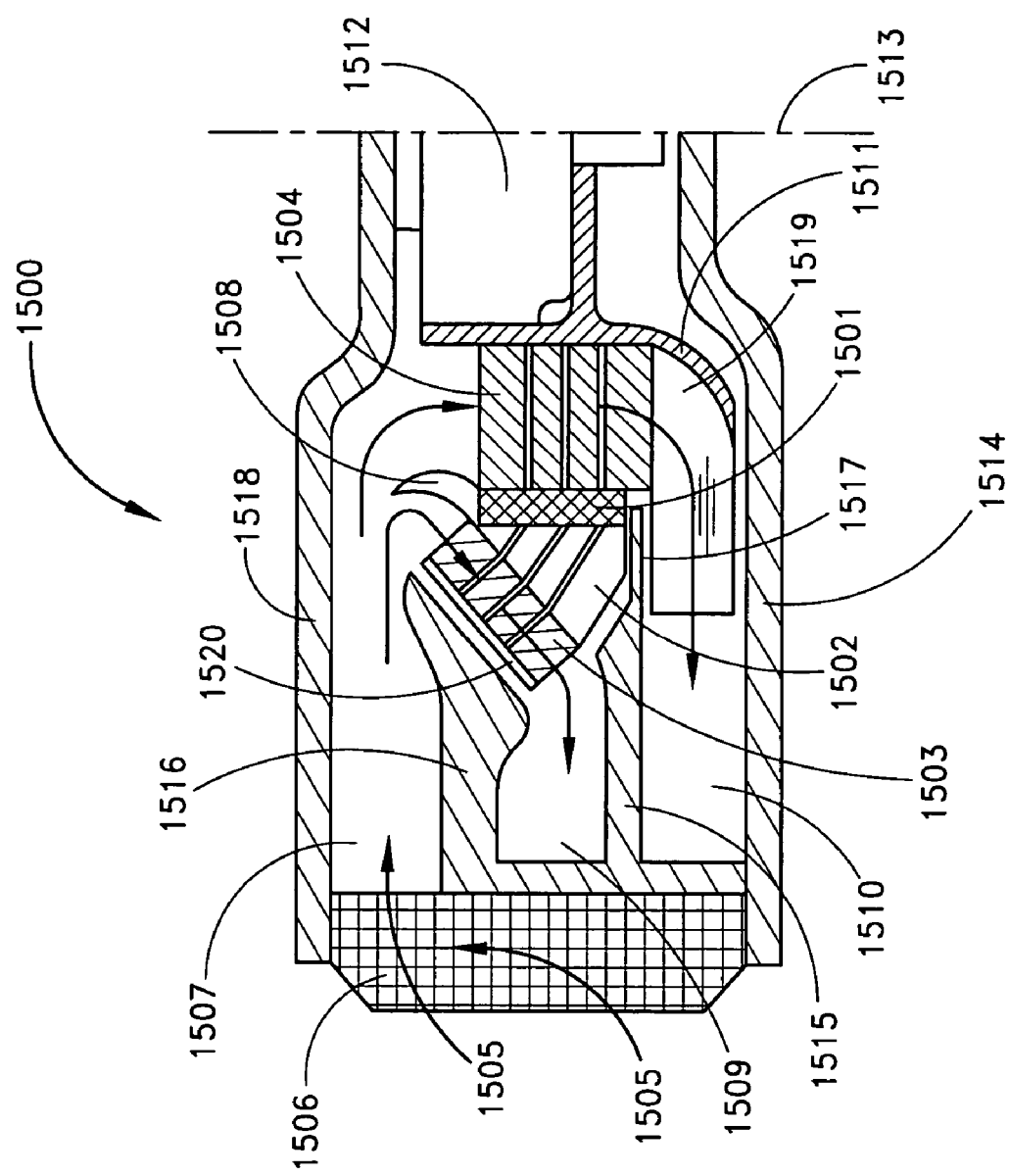
FIG. 15 depicts one portion of the rotary thermoelectric heat exchanger in the housing.

FIG. 15 depicts the left portion of another embodiment of a rotary thermoelectric heat exchanger 1500. The axis of rotation of this design is about the centerline 1513. Contacts, electrical connections to the thermoelectric device 1501 and exit ports for fluid 1505 are not shown. The right portion is a mirror image of the left portion, with the exceptions of the areas of the fluid chambers 1509 and 1510 which are portions of fan scrolls well-known to the art.

The outer surface of the thermoelectric device 1501 is in good, uniform thermal communication with a heat transfer member 1502. The heat transfer member 1502 is divided into four sections, each relatively thermally isolated from one another compared with the thermal conductivity in the direction from the thermoelectric array 1501 to the rotary heat exchanger array 1503. The rotary heat exchanger 1503 is similarly divided into four sections each in good, uniform thermal communication with a section of the heat transfer member 1502. The thermoelectric device 1501 is attached in its inner surface to a rotary heat exchanger 1504, which is divided into four sections, each preferably thermally isolated from the other. The above thermal isolation is consistent with the teachings of U.S. patent application Ser. No. 09/844,818, filed Apr. 27, 2001, which is incorporated by reference herein.

In general, in any of the embodiments in the description, the heat exchangers may be formed in segments or sections or in other manners to provide thermal isolation from section to section in the direction of fluid flow.

The rotary heat exchanger 1504 is mechanically attached to a rotor 1511 and fan blades 1519. The rotor 1511 is attached to a motor rotor 1512. The parts so attached rotate as a unit. A fluid chamber 1510 is formed by an outer wall 1514 and an insulator 1515. A second chamber 1509 is formed by the insulator 1515 and an inner wall 1516. A third chamber 1507 is formed by the inner wall 1507 and second outer wall 1518. A filter 1506 surrounds the rotary thermoelectric heat exchanger 1500. Fluid 1505 is drawn through the filter 1506, thence through the fluid chamber 1507 where a first portion goes through the heat exchanger 1503 and a second portion through the heat exchanger 1504. A flow directing member 1508 splits the fluid 1505 so that convective heat transfer is reduced from fluid stirring at the entrance to the rotary heat exchangers 1503 and 1504. Current is passed through the thermoelectric as described in FIG. 14.

If, for example, the outer side of the thermoelectric array 1501 is cooled, the thermal energy is transferred by the rotary heat exchanger 1502 cooling the first portion of the fluid 1506. The rotational motion generates centrifugal forces on the fluid 1506 so that the cooled fluid 1506 enters the fluid chamber 1510 and is pressurized. The conditioned fluid exits through a port (not shown). In this example, the inner side transfers heat to the rotary heat exchanger 1504 and thence to a second portion of the fluid 1506. The fan blades 1519 increase the pressure in the heated fluid 1506 and convey the fluid 1506 to the fluid chamber 1510. The fluid 1506 exits the fluid chamber 1510 through a port (not shown). A seal 1517 prevents significant convective heat transfer between the cold and hot fluid 1506 streams.

This assembly is capable of greater cooling or more efficient operation than the design of FIG. 14 due to the use of thermal isolation. As depicted, the heat transfer member 1502 and rotary heat exchangers 1503 and 1504 are divided into four sections. Other numbers of sections can be used. Performance increases with more sections and with higher material thermal conductivity.

In the preferred embodiment, the heat exchanger array 1503 is not aligned so that the fluid flows radially from the axis of the spin of the fan assembly 1511. Advantageously, a system incorporates a fan duct 1520 on to the rotary heat exchanger 1503 so as to maintain thermal isolation while directing fluid flow through all sections.

Figure 16:
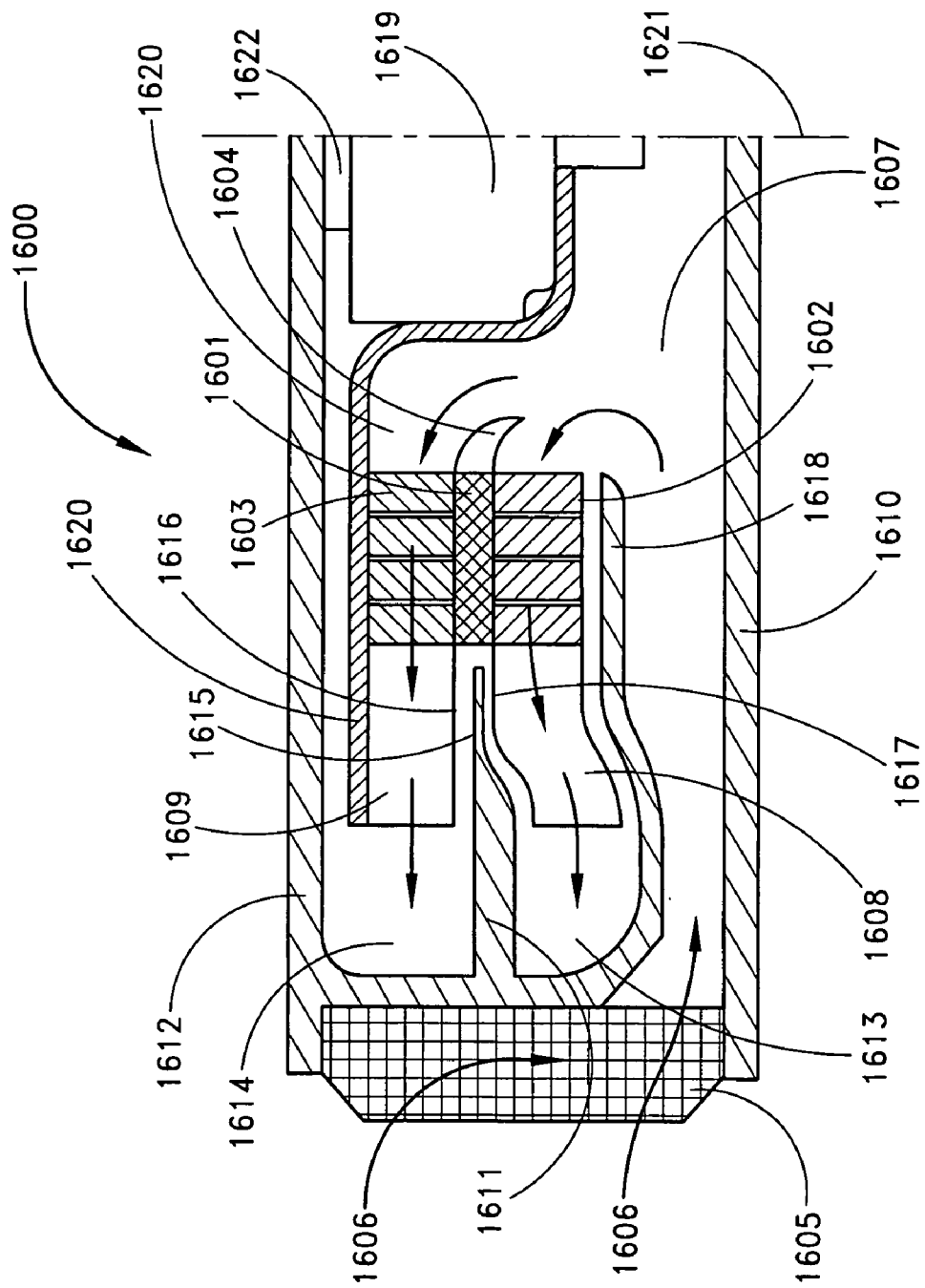
FIG. 16 depicts a cutaway of another embodiment of a rotary thermoelectric heat exchanger.

FIG. 16 depicts another embodiment of a thermoelectric heat exchanger with thermal isolation. A cutaway portion of a rotary thermoelectric heat exchanger system 1600 is shown with the centerline 1621 to the right as in FIG. 15. Again, contacts, thermoelectric circuitry, current flow and conditioned fluid exit ports are omitted for clarity. The system consists of a washer-shaped rotary thermoelectric device 1601 with a first rotary heat exchanger 1602 divided into four sections and a second rotary heat exchanger 1603 also divided into four sections, each in good, uniform thermal contact with the rotary thermoelectric array 1601. These parts are attached to a fan assembly 1620, which has two sets of fan blades 1608 and 1609, and in turn is attached to a motor rotor 1619. All of these parts rotate as a unit driven by the electric motor 1622.

A filter 1606 surrounds the assembly. A first wall 1610 and an inner insulator or wall 1618 form a fluid chamber 1607. A second fluid chamber 1613 is formed by the inner wall 1618 and an insulator 1611. A third chamber 1614 is formed by the insulator 1611 and a second wall 1612.

As in FIG. 14, by way of example, when suitable current is passed through the rotary thermoelectric device 1601 the side in thermal contact with the rotary heat exchanger 1602 is cooled, and the opposite side is heated. If the current is reversed, the cold side becomes hot, and the hot side becomes cold.

Fluid 1606 passes through the filter 1605 and flows along the chamber 1607. A first portion passes through the rotary heat exchanger 1602 where, for example, it is cooled and then goes into the fluid chamber 1613. A second portion passes through the rotary heat exchanger 1603 where it is heated and then goes into the fluid chamber 1614. The rotation of the fan assembly 1620 pressurizes the fluid in the fluid chambers 1613 and 1614. Advantageously, a flow-directing member 1604 serves to prevent stirring of the fluid 1606 as previously discussed in FIG. 14.

The rotary heat exchangers 1602 and 1603 are formed in sections to increase performance through thermal isolation in the direction of fluid flow as referenced in FIG. 15.

Figure 17:
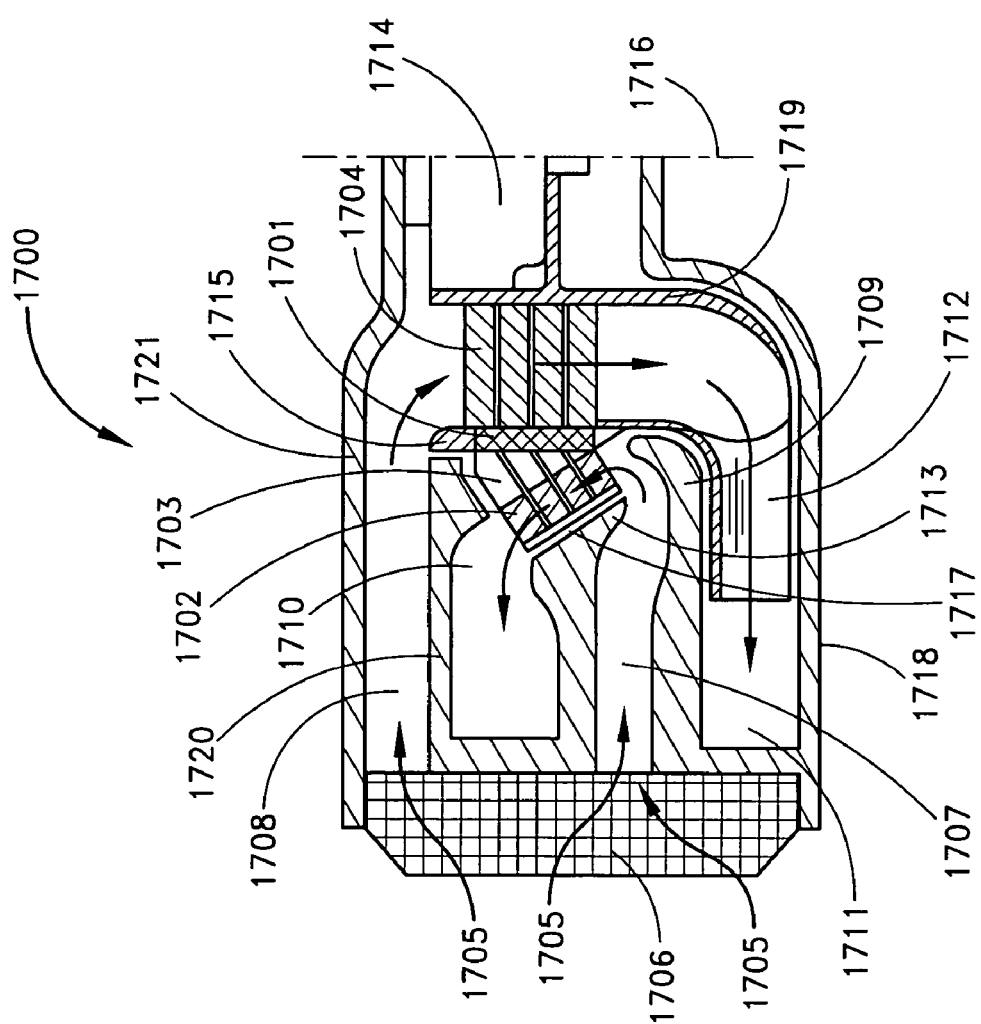
FIG. 17 depicts a cross-section of a portion of a thermoelectric heat exchanger.

FIG. 17 depicts a section of a rotary thermoelectric heat exchanger assembly 1700 with a centerline 1716 at the right. A rotary thermoelectric device 1701 is in good, uniform thermal contact with a rotary heat transfer member 1703 that is divided into sections and thence, to a rotary heat exchanger 1702, which is divided into corresponding sections. The other side of the rotary thermoelectric array 1701 is attached to a rotary heat exchanger 1704 that is divided into sections, and is attached to a fan assembly 1719. As with the prior figures, the division into sections or segments provides thermal isolation in the direction of fluid flow to increase efficiency of the unit. The fan assembly 1719 contains fan blades 1712. It is attached to a motor rotor 1714. Preferably, all parts attached to the fan assembly 1719 rotate in unison.

A chamber 1708 is formed by an upper wall 1721 and first insulator or wall 1720. A fluid chamber 1710 is formed by the first insulator 1720 and an insulator 1713. A chamber 1707 is formed by the insulator 1713 and a second insulator or wall 1709. A fluid chamber 1711 is formed by the insulator 1709 and a lower outer wall 1718. A filter 1706 surrounds the assembly.

The operation of the rotary thermoelectric heat exchanger 1700, is similar to that of FIG. 15, except that the fluid 1705 flows in a generally upward direction through the heat exchanger 1702 and downward through the heat exchanger 1703. In accordance with the teachings of patent application Ser. No. 09/844,818, this can further improve efficiency in some circumstances over that of the configuration of FIG. 15.

As in FIG. 15, if fluid 1706 flows on one side of the rotary thermoelectric array 1701, it can be heated and the other side cooled.

The system of FIG. 17 incorporates two walls 1709 and 1715 that separate flows by providing suitable barriers to convective heat transport between the hot and cold side fluids. The wall or flow directing member 1715 plays a similar role, and also acts to direct and smooth the flow of fluid 1705 as it enters the rotary heat exchanger 1704. It also incorporates a duct 1717 for the same purposes described in FIG. 15.

Figure 18:
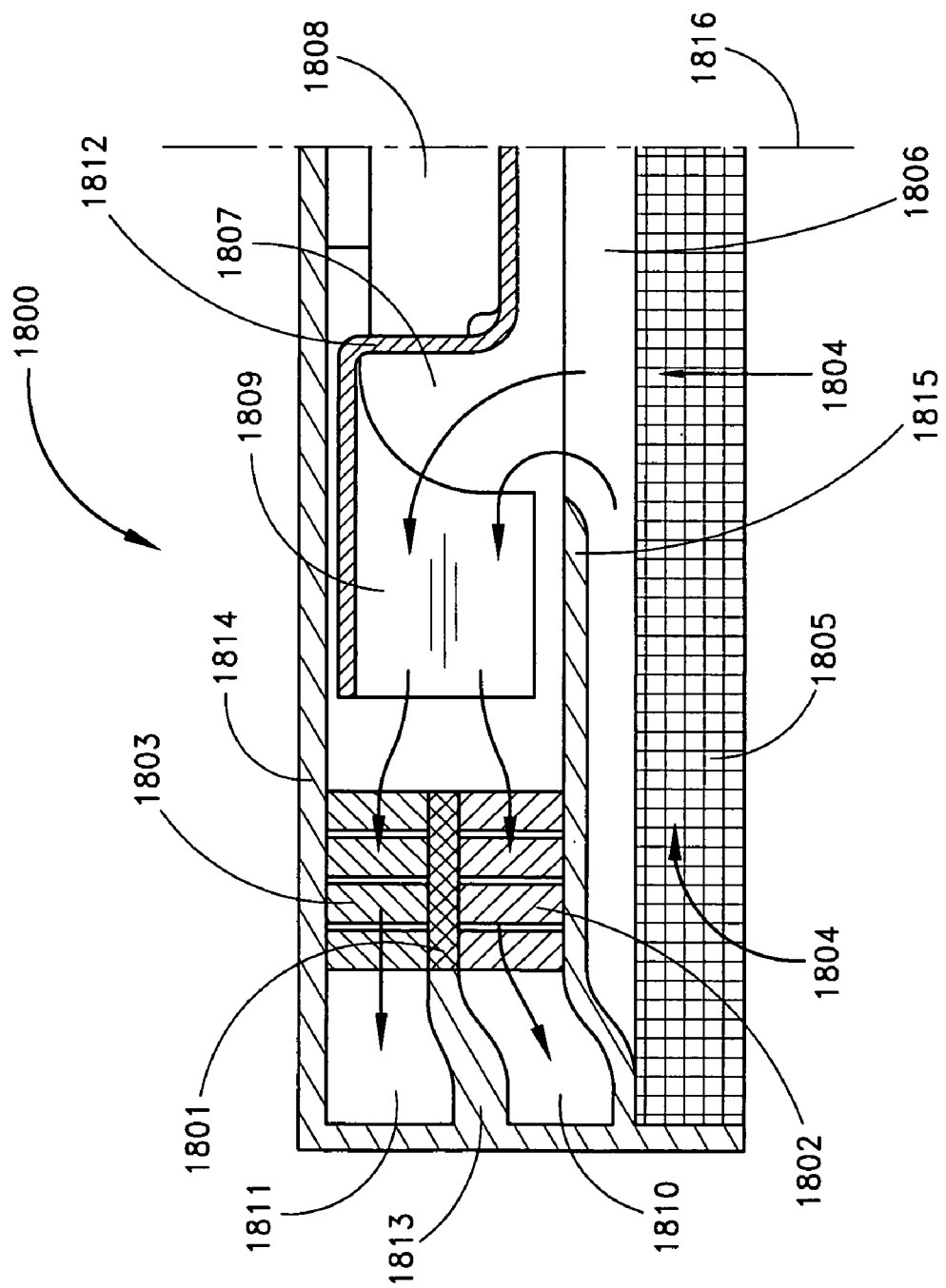
FIG. 18 depicts a portion of a thermoelectric heat exchanger, in which the heat exchangers are generally pancake-shaped, are stationary and attached to an insulator.

FIG. 18 depicts a portion of a thermoelectric heat exchanger system 1800, in which the heat exchangers 1802 and 1803, and the thermoelectric device 1801 are generally pancake-shaped, are stationary and are attached to an insulator 1813. The portion shown is generally rotationally symmetrical about the centerline 1816. The parts can be of the same general structure as those described in FIG. 16. Omitted for clarity, are details of electrical circuitry current paths and terminals that power the thermoelectric element array 1801. However, in this configuration, no contacts are required as the thermoelectric array is stationary.

A fan assembly 1812 with the fan blades 1809 is attached to a motor rotor 1808. A filter 1805 is attached to the lower part of the assembly, with its upper most surface positioned by grillwork or radial ribs 1806. The filter 1805, an insulated flow directing member 1815 and fan assembly 1812 form a chamber 1807. A first fluid chamber 1810 is formed by a portion of the insulated flow directing member 1815 and the insulator 1813. A second fluid chamber 1811 is formed by the insulator 1813 and a wall 1814.

Fluid 1804 passes through the filter 1805 into the chamber 1807. The fluid 1805 is pressurized as it passes by the fan blades 1809. A first portion passes through the heat exchanger 1802 where, for example, it is cooled. The cooled fluid 1805 passes into a chamber 1810 from where it exits the assembly through a port (not shown). A second portion of the fluid is heated as it passes through the heat exchanger 1803 and enters the chamber 1811. It exits the assembly through a port (not shown).

As with the previous embodiments of FIGS. 15, 16 and 17, the heat exchangers 1802, 1803 are formed in sections or segments to provide thermal isolation in the direction of fluid flow. As explained above, this improves efficiency of the thermal electric system.

The method and apparatus of the present invention are applicable to many uses, such as seats and wheelchairs, but it is not limited to use in seats. The method and apparatus is useful anywhere a localized flow of conditioned air is desired.

The present apparatus and method is not limited to the use of air or other gases. Indeed, some gases, such as helium, have greater thermal conductivity than air and are desirable in certain applications, while other gasses such as oxygen, nitrogen or argon may be more desirable in other applications. A variety of gases and gas mixtures can be used as the particular application requires.

Further, liquids can be used with the present invention. By applying appropriate liquid seals and insulators known in the art, the liquid circulating through the heat exchanger can be kept from affecting the performance of electrical contacts, the thermoelectric device, and any other electrical components. Thus, liquids such as water and antifreeze are contemplated for use with the present method and apparatus, as are liquid metals such as liquid sodium. Also contemplated are slurries of fluids and solids. The particular fluid used will depend upon the application. The increased thermal conductivity achieved by passing liquids over the rotating heat exchanger offer the possibility of increased heat conduction over that of less dense and less conductive gases. Whether a liquid or gas is most advantageous will vary with the particular application. For ease of reference, the term "fluid" is used to refer to gases, liquids, slurries and combinations thereof.

Because the temperature change available from a thermoelectric system can be significant, the rotating heat exchangers of the present invention have potential applicability to a wide variety of uses. The method and apparatus described herein are generally applicable to any situation where there is a desire to pump a thermally conditioned fluid. Such applications include constant temperature devices, as for example devices using a reference temperature as in a thermocouple assembly. Another exemplary application is in componentry for constant temperature baths for laboratory equipment and experiments. The method and apparatus described herein are particularly useful for applications requiring low flow rates and/or small temperature changes, but the invention is not so limited and may find application in situations requiring large flow rates and/or substantial temperature differences.

By placing a temperature sensor at a predetermined location, whether on the heat exchanger, the rotating fan, upstream or downstream of the heat exchanger, and electronically controlling the thermoelectric and the fan rotation, a controlled stream of thermally conditioned fluid can be provided to maintain the temperature at a predetermined temperature, or to provide predetermined thermal conditions. Thus, the invention provides advantages where localized thermal control is desired, as in vehicle seats, waterbeds, aquariums, water coolers, and cooling of beverages such as wine and punch.

Further, this device and method find particular application in situations where a fluid of differing temperature is desired at various times. The device may be operated as a fan capable of heating and cooling. The thermoelectric aspect can be activated when desired to thermally condition the fluid. Thus a heated, cooled, or neutral temperature fluid can be provided by the same device and method.

Although the foregoing description is of several preferred embodiments has been shown, described, and pointed out certain novel features of the inventions, it will be understood that various omissions, substitutions, combinations and changes in the form of the detail of the apparatus as illustrated as well as the uses thereof, may be made by those skilled in the art without departing from the spirit of the present invention. Also, one or more various components of one figure or embodiment may be used in different combinations with components of other figures to produce specific combinations not pictured in any one figure. For example, the fluid flow direction through heat exchanger 1802 of FIG. 18 could be reversed by adding an insulating wall to the end of the thermoelectric device 1801 so as to create an additional fluid chamber. In this example, the fluid would be pulled toward the rotational axis and then could be pumped outward through a second fan blade attached to fan rotor 1812 and exit in a generally radially outward direction through yet an additional fluid chamber with its lower side formed by the insulated flow directing member 1815. Thus, in this example, FIG. 18 is combined with opposing flow as described in FIG. 17, has the number of flow passages of FIG. 17, and the number of fan blades that are not heat exchangers of FIG. 16. Consequently, the scope of the present invention should not be limited by the foregoing discussion, which is intended to illustrate rather than limit the scope of the invention. The words used in the attached claims are used in their ordinary meaning sense, with no special or restrictive meaning intended by anything stated in the above description.

What is claimed is:

1. A system for providing a conditioned fluid, comprising:
   a motor including a stator and a rotor that extends about an axis and that rotates relative to the stator; and
   a thermoelectric element defining an opening therethrough about the axis, the thermoelectric element coupled to the rotor,
   wherein the motor extends through the opening in the thermoelectric element.

2. The system of claim 1, further comprising first and second heat exchangers, the first heat exchanger disposed on one side of the thermoelectric element and the second heat exchanger disposed on another side of the thermoelectric element.

3. The system of claim 2, wherein the heat exchangers and the thermoelectric device rotate about an axis of the rotor, the heat exchangers configured to induce a fluid flow along the heat exchangers.

4. The system of claim 1, wherein the thermoelectric element has a generally planar first side adjacent the first heat exchanger and has a generally planar second side adjacent the second heat exchanger.

5. The system of claim 1, wherein the stator is disposed within the rotor.

6. The system of claim 1, wherein the thermoelectric element is a Peltier element.

7. A method for conditioning a fluid flow, comprising:
   providing a current to a rotor to cause the rotor to rotate relative to a stator about an axis of rotation; and
   supplying a current to a thermoelectric element coupled to the rotor to provide a temperature differential across the thermoelectric element, the thermoelectric element defining an opening therein about said axis of rotation,
   wherein the rotor is disposed along the axis of rotation and extends through the opening in the thermoelectric element.

8. The method of claim 7, wherein rotating the rotor includes rotating first and second heat exchangers about an axis of the rotor, the first and second heat exchangers coupled to the thermoelectric element.

9. The method of claim 8, wherein rotation of the first and second heat exchangers induces a fluid flow along the first and second heat exchangers.

10. The method of claim 7, wherein the rotor rotates about the stator.

11. A system for providing conditioned fluid to a seat, comprising:
- a thermoelectric unit configured to convert electrical energy into thermal energy to generate a temperature change in response to an electrical current applied to the unit, the thermoelectric unit mounted so as to rotate about a rotational axis, the thermoelectric unit defining an opening therein about the rotational axis;
- a heat transfer unit having an outlet in fluid communication with a seat, the heat transfer unit comprising:
  - a flow generator rotatable about the axis, the flow generator configured to induce a fluid flow when rotated, the flow generator in conductive thermal communication with the thermoelectric unit so that the flow generator conducts the temperature change generated by the heat transfer unit to transfer the temperature change to the fluid flowing across the heat transfer unit; and
  - a housing having an inlet and an outlet on an exterior of the flow generator, the housing and flow generator cooperating to intake fluid along the rotational axis and to expel temperature conditioned fluid from the housing in a plane orthogonal to the rotational axis, the flow generator defining a recess into which at least a portion of a motor is positioned, the motor disposed along the axis of rotation and extending through the opening in the thermoelectric element, the motor configured to rotate the flow generator.

12. The system of claim 11, wherein at least one of the inlet and outlet of the housing is on a periphery of the flow generator.

13. An apparatus for thermally conditioning a fluid, comprising:
- a thermoelectric unit configured to convert electrical energy into thermal energy to produce a temperature change in response to an electrical current being applied to the unit, the thermoelectric unit comprising a circular disk having first and second opposing surfaces, the unit mounted so as to rotate about a rotational axis extending through the center of the disk; and
- an annular heat transfer unit having an inner diameter and an outer diameter and placed in conductive thermal communication with the thermoelectric device, the heat transfer unit mounted on one of the first and second opposing surfaces and configured to rotate about the axis, the heat transfer device having thermally radiating surfaces arranged to induce a fluid flow across the first and second surfaces outward from the rotational axis when rotated about the axis, the heat transfer device having a height measured along the rotational axis and the diameters being measured along an axis orthogonal to the rotational axis,
- wherein the distance between the inner and outer diameters is greater than the height.

14. An apparatus for thermally conditioning a fluid, comprising:
- a thermoelectric device configured to convert electrical energy into thermal energy to produce a temperature change in response to an electrical current being applied to the device, the thermoelectric device comprising a circular disk having first and second opposing surfaces, the thermoelectric device mounted so as to rotate about a rotational axis extending through the center of the disk; and
- an annular heat transfer unit comprising:
  - a first series of heat transfer surfaces in conductive thermal communication with the first surface of the thermoelectric device, the first series of heat transfer surfaces aligned with a plurality of axes orthogonal to the rotational axis; and
  - a second series of heat transfer surfaces in conductive thermal communication with the second surface of the thermoelectric unit, the second series of heat transfer surfaces aligned with a plurality of axes orthogonal to the rotational axis,
- wherein at least a portion of the first and second series of heat transfer surfaces comprise folds of a thermally conductive material, the first and second series of heat transfer surfaces further configured to induce a fluid flow across the surfaces outward from the rotational axis when rotated about the axis.

* * * * *